(12) United States Patent
van der Straten et al.

(10) Patent No.: US 12,167,700 B2
(45) Date of Patent: Dec. 10, 2024

(54) REPLACEMENT BOTTOM ELECTRODE STRUCTURE FOR MRAM DEVICES

(71) Applicant: International Business Machines Corporation, Armonk, NY (US)

(72) Inventors: Oscar van der Straten, Guilderland Center, NY (US); Koichi Motoyama, Clifton Park, NY (US); Joseph F. Maniscalco, Lake Katrine, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 611 days.

(21) Appl. No.: 17/393,847

(22) Filed: Aug. 4, 2021

(65) Prior Publication Data
US 2023/0044333 A1    Feb. 9, 2023

(51) Int. Cl.
*H10N 50/80* (2023.01)
*H10B 61/00* (2023.01)
*H10N 50/01* (2023.01)

(52) U.S. Cl.
CPC .............. *H10N 50/80* (2023.02); *H10N 50/01* (2023.02); *H10B 61/22* (2023.02)

(58) Field of Classification Search
CPC ........ H10N 50/80; H10N 50/01; H10N 50/10; H10B 61/22
See application file for complete search history.

(56) References Cited

U.S. PATENT DOCUMENTS

| 8,283,186 B2 | 10/2012 | Kim |
| 9,559,294 B2 | 1/2017 | Hsu et al. |
| 10,825,499 B2 | 11/2020 | Chuang et al. |
| 2006/0002184 A1* | 1/2006 | Hong ............... B82Y 40/00 365/171 |
| 2009/0209050 A1 | 8/2009 | Wang et al. |
| 2011/0044096 A1* | 2/2011 | Li ............... H01L 21/67011 365/158 |
| 2011/0049655 A1 | 3/2011 | Assefa et al. |
| 2016/0351792 A1* | 12/2016 | Jiang ............... H10B 61/20 |
| 2017/0279036 A1* | 9/2017 | Mo ............... H10N 50/10 |
| 2019/0013354 A1 | 1/2019 | Lee et al. |
| 2020/0006631 A1* | 1/2020 | Sato ............... G11C 11/161 |
| 2020/0136015 A1* | 4/2020 | Hung ............... H01L 21/76838 |
| 2020/0295256 A1* | 9/2020 | Hashemi ............... H10B 61/00 |
| 2021/0234091 A1* | 7/2021 | Kim ............... H10N 50/01 |
| 2021/0343931 A1* | 11/2021 | Chiou ............... H10N 50/01 |

(Continued)

FOREIGN PATENT DOCUMENTS

CN    108807664 A    11/2018
CN    109873076 A    6/2019

*Primary Examiner* — Herve-Louis Y Assouman
*Assistant Examiner* — Linda J. Fleck
(74) *Attorney, Agent, or Firm* — Scully, Scott, Murphy & Presser, P.C.; L. Jeffrey Kelly, Esq.

(57) ABSTRACT

Memory structures including an MTJ-containing pillar that is void of re-sputtered bottom electrode metal particles is provided by first forming the MTJ-containing pillar on a sacrificial material-containing structure, and thereafter replacing the sacrificial material-containing structure with at least a replacement bottom electrode structure. In some embodiments, the sacrificial material-containing structure is replaced with both a bottom electrode diffusion barrier liner and a replacement bottom electrode structure.

18 Claims, 18 Drawing Sheets

(56) References Cited

U.S. PATENT DOCUMENTS

| | | | |
|---|---|---|---|
| 2021/0359199 A1* | 11/2021 | Lin | H10N 50/10 |
| 2023/0016126 A1* | 1/2023 | Lee | H10N 50/80 |
| 2023/0380296 A1* | 11/2023 | Chiu | H10N 50/80 |
| 2024/0090337 A1* | 3/2024 | van der Straten | H10B 61/00 |

* cited by examiner

REPLACEMENT BOTTOM ELECTRODE STRUCTURE FOR MRAM DEVICES

BACKGROUND

The present application relates to magnetoresistive random access memory (MRAM), and more particularly to a memory structure which includes a replacement bottom electrode structure located beneath a magnetic tunnel junction (MTJ)-containing pillar that is void of re-sputtered bottom electrode metal particles.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates is a permanent magnetic set to a particular polarity (i.e., a magnetic reference layer); the other plate's magnetization can be changed to match that of an external field to store memory (i.e., a magnetic free layer). Such a configuration is known as a magnetic tunnel junction (MTJ)-containing pillar. In leading-edge or neuromorphic computing systems, an MTJ-containing pillar is typically embedded within a back-end-of-the-line (BEOL) structure.

In the manufacturing of a MRAM device, blanket layers of MTJ-containing materials including at least a magnetic reference material, a tunnel barrier, and a magnetic free material are formed upon a bottom electrode of the MRAM device. The blanket layers are then patterned by lithography and etching to provide an MTJ-containing pillar (including remaining portions of the magnetic reference material, the tunnel barrier, and the magnetic free material) located on the bottom electrode.

The etching of the blanket layers of MTJ-containing materials typically includes an ion beam etch (IBE) or a reactive ion etch (RIE). During such etching processes, bottom electrode metal particles can be re-sputtered, and thereafter the re-sputtered bottom electrode metal particles can deposit on the sidewall of the MTJ-containing pillar. The re-sputtered and deposited bottom electrode metal particles can lead to MRAM device shorting. There is thus a need to provide a MRAM device in which shorts caused by the re-sputtered and deposited bottom electrode metal particles are mitigated and even eliminated.

SUMMARY

Memory structures including an MTJ-containing pillar that is void of re-sputtered bottom electrode metal particles is provided by first forming the MTJ-containing pillar on a sacrificial material-containing structure. The sacrificial material-containing structure is thereafter replaced with at least a replacement bottom electrode structure. In some embodiments, the sacrificial material-containing structure is replaced with both a bottom electrode diffusion barrier liner and a replacement bottom electrode structure.

In one aspect of the present application, a memory structure is provided in which no re-sputtered bottom electrode metal particles are present on the sidewall of the MTJ-containing pillar. In one embodiment, the memory structure includes a replacement bottom electrode structure having a horizontal portion and a vertical portion extending upward from each end of the horizontal portion. An MTJ-containing pillar is located between the vertical extending portions of the replacement bottom electrode structure and above the horizontal portion of the replacement bottom electrode structure.

In some embodiments, a bottom electrode diffusion barrier liner is also present in the memory structure. In such an embodiment, the bottom electrode diffusion barrier liner has an upper portion lining an upper surface of the replacement bottom electrode structure and a lower portion lining a lower surface of the replacement bottom electrode structure, wherein the lower portion and the upper portion of the bottom electrode diffusion barrier liner are U-shaped.

In another embodiment, the memory structure includes a bottom electrode diffusion barrier liner having an upper portion lining an upper surface of a replacement bottom electrode structure and a lower portion lining a lower surface of the replacement bottom electrode structure, wherein the lower portion of the bottom electrode diffusion barrier liner is U-shaped and wherein the upper portion of the bottom electrode diffusion barrier liner is planar and is spaced apart from the lower portion of the bottom electrode diffusion barrier liner. An MTJ-containing pillar is located above the replacement bottom electrode structure.

In yet another embodiment, the memory structure includes a replacement bottom electrode structure sandwiched between a lower portion of a bottom electrode diffusion barrier liner and an upper portion of the bottom electrode diffusion barrier liner, and an MTJ-containing pillar is located above the replacement bottom electrode structure.

In another aspect of the present application, a method of forming a memory structure in which no bottom electrode metal particles are present on the sidewall of the MTJ-containing pillar is provided. In one embodiment, the method includes forming the MTJ-containing pillar on a sacrificial material-containing structure. The sacrificial material-containing structure is then replaced with at least a replacement bottom electrode structure. In some embodiments, the sacrificial material-containing structure is replaced with both a bottom electrode diffusion barrier liner and a replacement bottom electrode structure.

DETAILED DESCRIPTION

Figure 1:
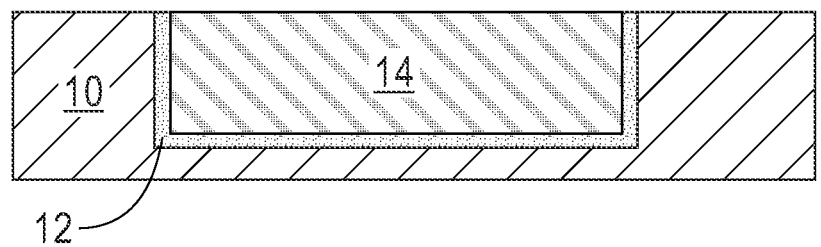
FIG. 1 is a cross sectional view of an exemplary structure that can be employed in accordance with an embodiment of the present application, the exemplary structure including a first electrically conductive structure embedded in a first interlayer dielectric (ILD) material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Prior to discussing the present application in detail, it is noted that FIGS. 1-36 of the present application depict a memory device area in which a memory structure in accordance with the present application will be formed; the device area is present in the BEOL. The memory structure in accordance with the present application is present in a metal level that is located above a front-end-of-the-line (FEOL) level. A non-memory device area may be located laterally adjacent to the memory device area illustrated in the present application. The non-memory device area is an area in which interconnect structures, capacitors, resistors, and/or eFuses can be formed. It is noted that although a single MTJ-containing pillar is illustrated in each of the drawings, an array of MTJ-containing pillars can be formed in the present application.

Referring first to FIG. 1, there is illustrated an exemplary structure that can be employed in accordance with an embodiment of the present application. The exemplary structure of FIG. 1 includes a first electrically conductive structure 14 embedded in a first interlayer dielectric (ILD) material layer 10. Collectively, the first electrically conductive structure 14 and the ILD material layer 10 provide a metal level, $M_n$, wherein n is any integer starting from 1; the upper limit of 'n' can vary and can be predetermined by the manufacturer of a specific integrated circuit.

In some embodiments (as is shown in FIG. 1), a diffusion barrier liner 12 can be located between the first electrically conductive structure 14 and the first ILD material layer 10. In other embodiments, the diffusion barrier liner 12 can be omitted. It should be noted that the first electrically conductive structure 14 can extend entirely through the first ILD material layer 10, or other electrically conductive structures such as, for example, metal lines and/or metal vias, can be located directly beneath, and in contact with, the first electrically conductive structure 14. For simplicity, the drawings of the present application only show that the first electrically conductive structure 14 extends partially through the first ILD material layer 10. It is even further noted that a plurality of first electrically conductive structures 14 and optional diffusion barrier liners 12 can be formed into the first ILD material layer 10.

Although not illustrated in any of the drawings of the present application a substrate can be located beneath metal level, $M_n$. The substrate can include a FEOL level including one or more semiconductor devices, such as, for example, field effect transistors located on a semiconductor material; a middle-of-the-line (MOL) level including a plurality of metal contact structures embedded in a MOL dielectric material layer; at least one lower interconnect level that includes a plurality of lower interconnect structures embedded in a lower interconnect dielectric material layer; or any combination thereof. In one example, the substrate includes a FEOL level and a MOL level.

The metal level, $M_n$, can be formed utilizing techniques that are known to those skilled in the art. In one embodiment, a damascene process can be used in forming metal level, $M_n$. A damascene process can include forming at least one opening into the first ILD material layer 10, filling the each opening with an optional diffusion barrier layer, and an electrically conductive material and, if needed performing a planarization process such as, for example, chemical mechanical polishing (CMP) to remove the optional diffusion barrier layer and the electrically conductive material from the topmost surface of the first ILD material layer 10. The diffusion barrier layer that remains in the at least one opening can be referred to herein as diffusion barrier liner 12, and the electrically conductive material that remains in the at least one opening can be referred to herein as first electrically conductive structure 14. In some embodiments, and as shown in FIG. 1, the first electrically conductive structure 14 has a topmost surface that is coplanar with a topmost surface of the first ILD material layer 10 as well as with a topmost surface of the diffusion barrier liner 12, if the same is present.

The first ILD material layer 10 can be composed of a dielectric material such as, for example, silicon dioxide, silicon nitride, undoped silicate glass (USG), fluorosilicate glass (FSG), borophosphosilicate glass (BPSG), a spin-on low-k dielectric material, a chemical vapor deposition (CVD) low-k dielectric material or any combination thereof. The term "low-k" as used throughout the present application denotes a dielectric material that has a dielectric constant of less than silicon dioxide. Illustrative low-k dielectric materials that can be used as the first ILD material layer 10 include, but are not limited to, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Although not shown, the first ILD material layer 10 can include a multilayered structure that includes at least two different dielectric materials stacked one atop the other. The first ILD material layer 10 can be formed utilizing a deposition process including, for example, chemical vapor deposition (CVD), plasma enhanced chemical vapor deposition (PECVD), evaporation or spin-on coating.

The diffusion barrier layer (and thus the resultant diffusion barrier liner 12) that can optionally be employed in the present application in metal level, $M_n$, includes a diffusion barrier material (i.e., a material that serves as a barrier to prevent a conductive material such as copper from diffusing there through). Examples of diffusion barrier materials that can be used in providing the diffusion barrier layer (and thus the resultant diffusion barrier liner) include, but are not limited to, Ta, TaN, Ti, TiN, Ru, RuN, RuTa, RuTaN, W, or WN; in some instances of the present application chemical symbols, as found in the Periodic Table of Elements, are used instead of the full names of the elements or compounds. In some embodiments, the diffusion barrier material can include a material stack of diffusion barrier materials. In one example, the diffusion barrier material can be composed of a stack of Ta/TaN. The diffusion barrier layer can be formed by a deposition process such as, for example, CVD, PECVD, or physical vapor deposition (PVD).

The electrically conductive material that provides the first electrically conductive structure 14 can include, but is not limited to, Cu, Al, W or any alloy thereof (i.e., a Cu—Al alloy). The electrically conductive material that provides the first electrically conductive structure 14 can be formed by a deposition process such as, for example, CVD, PECVD, PVD, sputtering or plating. In some embodiments, a reflow anneal can follow the deposition of the electrically conductive material that provides the first electrically conductive structure 14.

Figure 2:
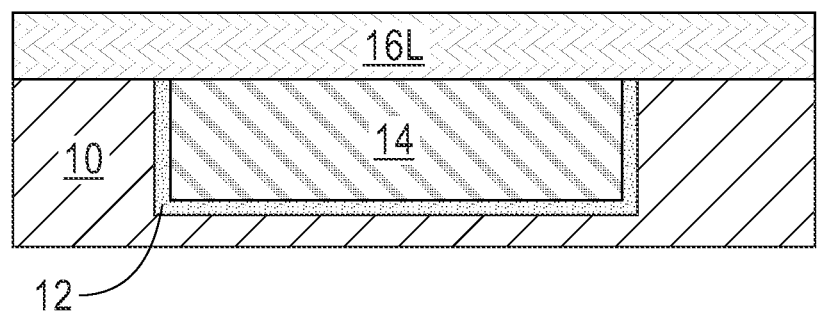
FIG. 2 is a cross sectional view of the exemplary structure of FIG. 1 after forming a blanket layer of sacrificial material on the first ILD material layer and the first electrically conductive structure.

Referring now to FIG. 2, there is illustrated the exemplary structure of FIG. 1 after forming a blanket layer of sacrificial material 16L on the first ILD material layer 10 and the first electrically conductive structure 14. When the optional diffusion barrier liner 12 is present, the blanket layer of sacrificial material 16L is also formed on the optional diffusion barrier liner 12.

The blanket layer of sacrificial material 16L is composed of a dielectric material that is compositionally different from the dielectric material that provides the first ILD material layer 10. Illustrative examples of dielectric materials that can be used as the blanket layer of sacrificial material 16L include, but are not limited to, silicon dioxide, silicon nitride or silicon carbon nitride. The blanket layer of sacrificial material 16L can be formed by a deposition process including, for example, CVD, PECVD or PVD. The blanket layer of sacrificial material 16L can have a thickness, as measured from a bottommost surface of the blanket layer of sacrificial material 16L to a topmost surface of the blanket layer of sacrificial material 16L, of from 2 nm to 100 nm; although other thicknesses for the blanket layer of sacrificial material 16L are contemplated and can be used in the present application.

Figure 3:
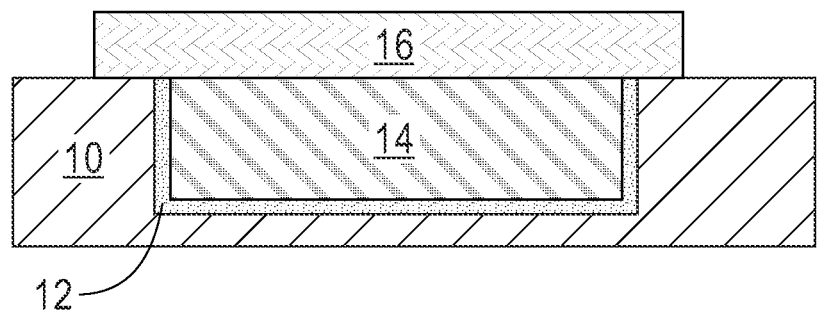
FIG. 3 is a cross sectional view of the exemplary structure of FIG. 2 after patterning the blanket layer of sacrificial material to provide a sacrificial material-containing structure covering at least an entirety of the first electrically conductive structure.

Referring now to FIG. 3, there is illustrated the exemplary structure of FIG. 2 after patterning the blanket layer of sacrificial material 16L to provide a sacrificial material-containing structure 16 covering at least an entirety of the first electrically conductive structure 14. The sacrificial material-containing structure 16 can also cover an entirety of the optional diffusion barrier liner 12 and the sacrificial material-containing structure 16 can also extend on to a topmost surface of the first ILD material layer 10. The patterning of the blanket layer of sacrificial material 16L can include lithography and etching. In some embodiments, the etching can include a reactive ion etch.

The sacrificial material-containing structure 16 is typically cylindrical in shape; although other asymmetric shapes are possible and can be used in the present application as the shape of the sacrificial material-containing structure 16. The sacrificial material-containing structure 16 has a thickness that is the same as the thickness mentioned above for the blanket layer of sacrificial material 16L. The sacrificial material-containing structure 16 can have a width, as measured from one sidewall to the opposing sidewall, of from 10 nm to 400 nm; although other widths for the sacrificial material-containing structure 16 are contemplated and can be used in the present application.

Figure 4:
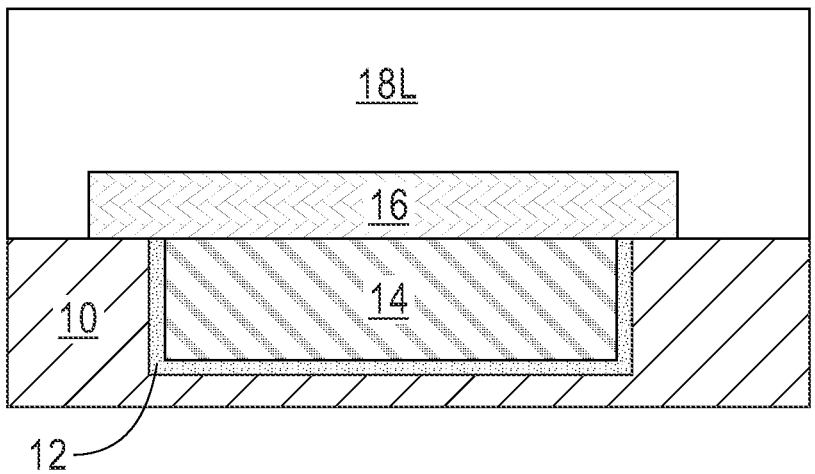
FIG. 4 is a cross sectional view of the exemplary structure of FIG. 3 after forming a layer of dielectric fill material on the sacrificial material-containing structure and physically exposed portions of the first ILD material layer.

Referring now to FIG. 4, there is illustrated the exemplary structure of FIG. 3 after forming a layer of dielectric fill material 18L on the sacrificial material-containing structure 16 and physically exposed portions of the first ILD material layer 10. The layer of dielectric fill material 18L includes a dielectric material that is compositionally different from the dielectric material that provides the sacrificial material-containing structure 16. The dielectric material that provides the layer of dielectric fill material 18L can include one of the dielectric materials mentioned above for the first ILD material layer 10. In some embodiments, the dielectric material that provides the layer of dielectric fill material 18L is compositionally the same as the dielectric material that provides the first ILD material layer 10. In other embodiments, the dielectric material that provides the layer of dielectric fill material 18L is compositionally different than the dielectric material that provides the first ILD material layer 10. The layer of dielectric fill material 18L can be formed utilizing one of the deposition methods mentioned above for forming the first ILD material layer 10. The layer of dielectric fill material 18L can have a thickness of from 100 nm to 1000 nm; although other thicknesses for the blanket layer of dielectric fill material 18L are contemplated and can be used in the present application.

Figure 5:
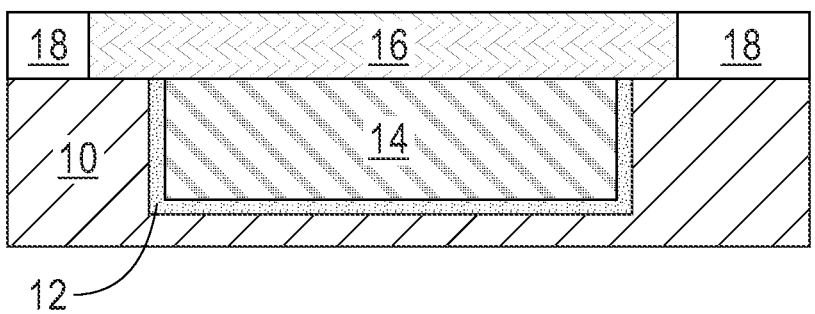
FIG. 5 is a cross sectional view of the exemplary structure of FIG. 4 after planarizing the layer of dielectric fill material to provide a dielectric fill structure located laterally adjacent to the sacrificial material-containing structure and on physically exposed portions of the first ILD material layer.

Referring now to FIG. 5, there is illustrated the exemplary structure of FIG. 4 after planarizing the layer of dielectric fill material 18L to provide a dielectric fill structure 18 located laterally adjacent to the sacrificial material-containing structure 16 and on physically exposed portions of the first ILD material layer 10. The planarizing of the layer of dielectric fill material 18L can include chemical mechanical polishing (CMP). The planarizing stops of the topmost surface of the sacrificial material-containing structure 16 such that the dielectric fill structure 18 has a topmost surface that is coplanar with a topmost surface of the sacrificial material-containing structure 16. In some embodiments, another material removal process besides planarization can be used to provide the exemplary structure shown in FIG. 5.

Figure 6A:
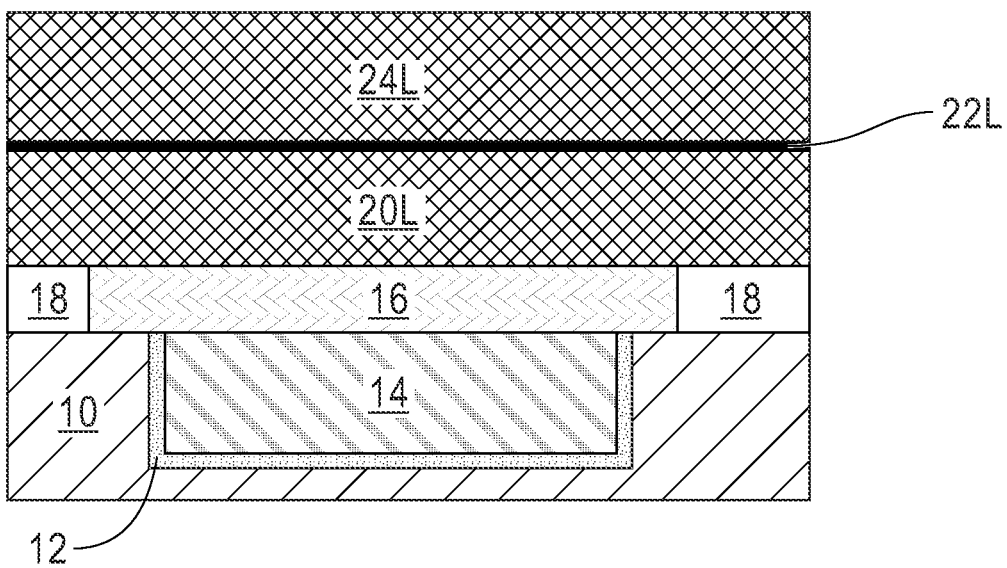
FIG. 6A is a cross sectional view of the exemplary structure of FIG. 5 after forming an MTJ-containing material stack on the dielectric fill structure and the sacrificial material-containing structure in accordance with one embodiment of the present application.
Figure 6B:
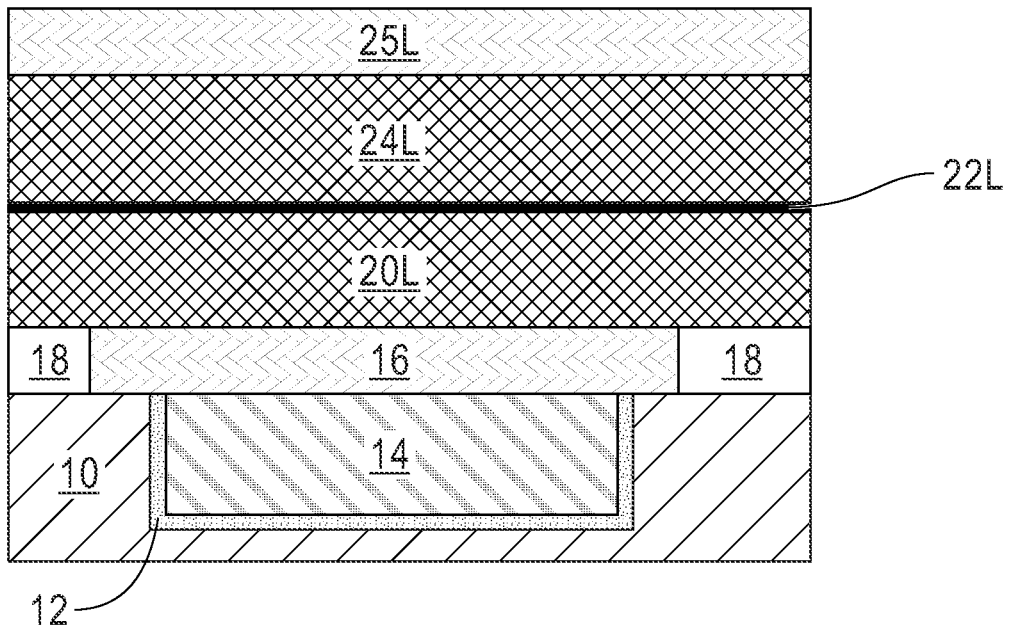
FIG. 6B is a cross sectional view of the exemplary structure of FIG. 5 after forming an MTJ-containing material stack on the dielectric fill structure and the sacrificial material-containing structure in accordance with another embodiment of the present application.

Referring now to FIGS. 6A-6B, there are illustrated the exemplary structure of FIG. 5 after forming an MTJ-containing material stack on the dielectric fill structure 18 and the sacrificial material-containing structure 16 in accordance with various embodiments of the present application. Notably, FIG. 6A illustrates an embodiment of the present application in which the MTJ-containing material stack does not include a separately deposited blanket layer of conductive electrode material. In this embodiment, an upper portion of the MTJ-containing material stack can serve as a top electrode in the final structure. In the embodiment shown in FIG. 6B, the MTJ-containing material stack includes a separately deposited blanket layer of conductive electrode material.

Notably, the MTJ-containing material stacks of FIG. 6A and FIG. 6B include at least blanket layers of the following materials: a magnetic pinned (or reference) material, a tunnel barrier material, and a magnetic free material. In FIG. 6B, a blanket layer of conductive electrode material is also present.

In some embodiments, the MTJ-containing material stack and as is shown in FIGS. 6A and 6B is a bottom pinned MTJ-containing material stack that includes, from bottom to top, a blanket layer of magnetic pinned material 20L, a blanket layer of tunnel barrier material 22L, a blanket layer of magnetic free material 24L, and an optional blanket layer of conductive electrode material 25L. An optional blanket layer of metal seed material (not shown) can also be present in the bottom pinned MTJ-containing material stack. In the bottom pinned MTJ-containing material stack, the optional blanket layer of metal seed material is formed beneath the blanket layer of magnetic pinned material 20L. The bottom pinned MTJ-containing material stack can also include a blanket layer of non-magnetic spacer material (not shown) located on the blanket layer of magnetic free material 24L, a second blanket layer of magnetic free material (not shown) located on the blanket layer of non-magnetic spacer material, and/or a blanket layer of MTJ cap material (not shown) located on the blanket layer of magnetic free material 24L or on the second blanket layer of magnetic free material.

In other embodiments, the MTJ-containing material stack (not shown in either FIG. 6A or 6B but can easily be deduced by flipping the position of the blanket layer of magnetic pinned material 20L and the blanket layer of magnetic free material 24L) is a top pinned MTJ-containing material stack that includes, from bottom to top, a blanket layer of magnetic free material 24L, a blanket layer of tunnel barrier material 22L, a blanket layer of magnetic pinned material 20L, and an optional blanket layer of conductive electrode material 25L. In such an embodiment, the top pinned MTJ-containing material stack can also include an optional blanket layer of metal seed material located beneath the blanket layer of magnetic free material 24L, a blanket layer of non-magnetic spacer material located on the blanket layer of magnetic free material 24L, a second blanket layer of magnetic free material located on the blanket layer of non-magnetic spacer material, and/or a blanket layer of MTJ cap material located on the blanket layer of magnetic pinned material 20L.

The various blanket layers of materials of the MTJ-containing material stack can be formed by utilizing one or more deposition processes such as, for example, sputtering, plasma enhanced atomic layer deposition (PEALD), PECVD or PVD.

The optional blanket layer of metal seed material can be composed of Pt, Pd, Ni, Rh, Ir, Re or alloys and multilayers thereof. In one example, the optional blanket layer of metal seed material is composed of Pt.

The blanket layer of magnetic pinned material 20L has a fixed magnetization. The blanket layer of magnetic pinned material 20L can be composed of a metal or metal alloy (or a stack thereof) that includes one or more metals exhibiting high spin polarization. In alternative embodiments, exemplary metals for the formation of the blanket layer of magnetic pinned material 20L include iron, nickel, cobalt, chromium, boron, or manganese. Exemplary metal alloys can include the metals exemplified by the above. In another embodiment, the blanket layer of magnetic pinned material 20L can be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the blanket layer of magnetic pinned material 20L.

The blanket layer of tunnel barrier material 22L is composed of an insulator material and is formed at such a thickness as to provide an appropriate tunneling resistance. Exemplary materials for the blanket layer of tunnel barrier material 22L include magnesium oxide, aluminum oxide, and titanium oxide, or materials of higher electrical tunnel conductance, such as semiconductors or low-bandgap insulators.

The blanket layer of magnetic free material 24L can be composed of a magnetic material (or a stack of magnetic materials) with a magnetization that can be changed in orientation relative to the magnetization orientation of the magnetic pinned layer. Exemplary magnetic materials for the blanket layer of magnetic free material 24L include alloys and/or multilayers of cobalt, iron, alloys of cobalt-iron, nickel, alloys of nickel-iron, and alloys of cobalt-iron-boron.

If present, the blanket layer of non-magnetic metallic spacer material is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer material allows for spin torque switching between a first blanket layer of magnetic free material (i.e., 24L) and a second blanket layer of magnetic free material (not shown).

If present, the second blanket layer of magnetic free material can include one of the magnetic materials mentioned above for blanket layer of magnetic free material 24L. In one embodiment, the second blanket layer of magnetic free material is composed of a same magnetic material as the blanket layer of magnetic free material 24L. In another embodiment, the second blanket layer of magnetic free material is composed of a magnetic material that is compositionally different from the blanket layer of magnetic free material 24L.

If present, the blanket layer of MTJ cap material can be composed of Nb, NbN, W, WN, Ta, TaN, Ti, TiN, Ru, Mo, Cr, V, Pd, Pt, Rh, Sc, Al or other high melting point metals or conductive metal nitrides. The blanket layer of MTJ cap material can have a thickness from 2 nm to 25 nm; other thicknesses are possible and can be used in the present application as the thickness of the blanket layer of MTJ cap material.

If present, the blanket layer of conductive electrode material 25L, which can function as a hard mask in a subsequent patterning process, can be composed of a conductive metal-containing material such as, for example, Ta, TaN, Ti, TiN, Ru, RuN, RuTa, RuTaN, Co, CoWP, CoN, W, WN or any combination thereof. In one embodiment of the present application, the optional blanket layer of conductive electrode material 25L is composed of Ti/TiN. In the present application and if present, the blanket layer of conductive electrode material 25L can have a thickness that is from 100 nm to 500 nm; although other thicknesses are possible and can be used as the thickness of the blanket layer of conductive electrode material 25L.

Figure 7:
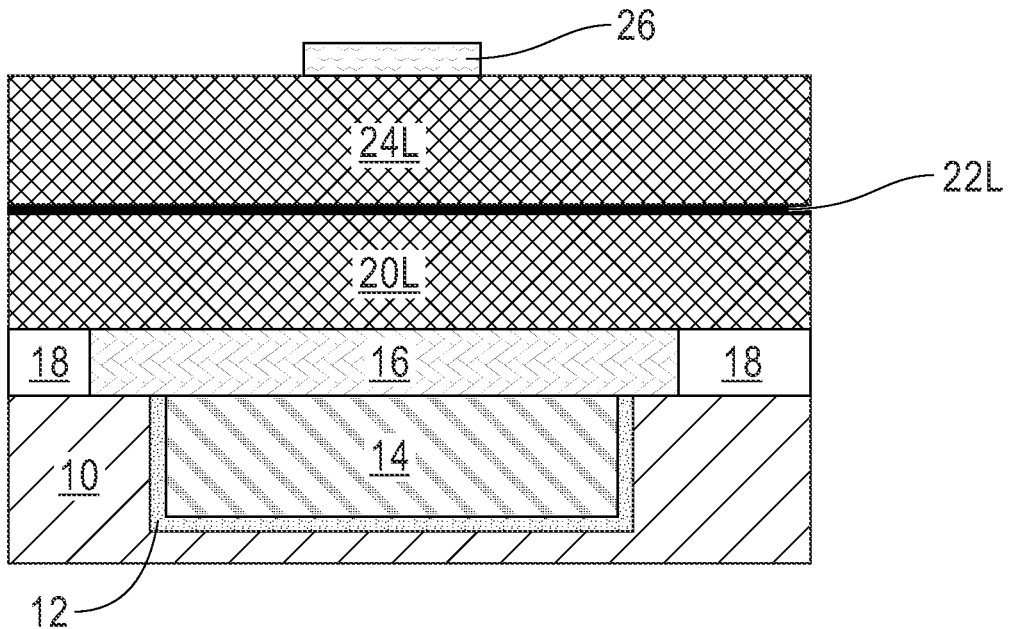
FIG. 7 is a cross sectional view of the exemplary structure of FIG. 6A after forming a patterned metal hard mask on the MTJ-containing material stack.

Referring now to FIG. 7, there is illustrated the exemplary structure of FIG. 6A after forming patterned metal hard mask 26 on the MTJ-containing material stack 20L/22L/24L. The patterned metal hard mask 26 is not employed with the MTJ-containing material stack shown in FIG. 6B since the blanket layer of conductive electrode material 25L serves as the hard mask in that embodiment of the present application.

In the illustrated embodiment of FIG. 7, the patterned metal hard mask 26 can be composed of a metal hard mask material such as, for example, Ta, TaN, Ti or TiN. The patterned metal hard mask 26 can be formed by deposition of the metal hard mask material, followed by lithography and etching. The patterned metal hard mask 26 has a thickness that erodes during the subsequently performed patterning of the MTJ-containing material stack. The patterned metal hard mask 26 can be cylindrical in shape; although other asymmetric shapes are possible and can be used in the present application as the shape of the patterned metal hard mask 26. The critical dimension (CD) of the patterned metal hard mask 26 is not critical for this application.

Figure 8A:
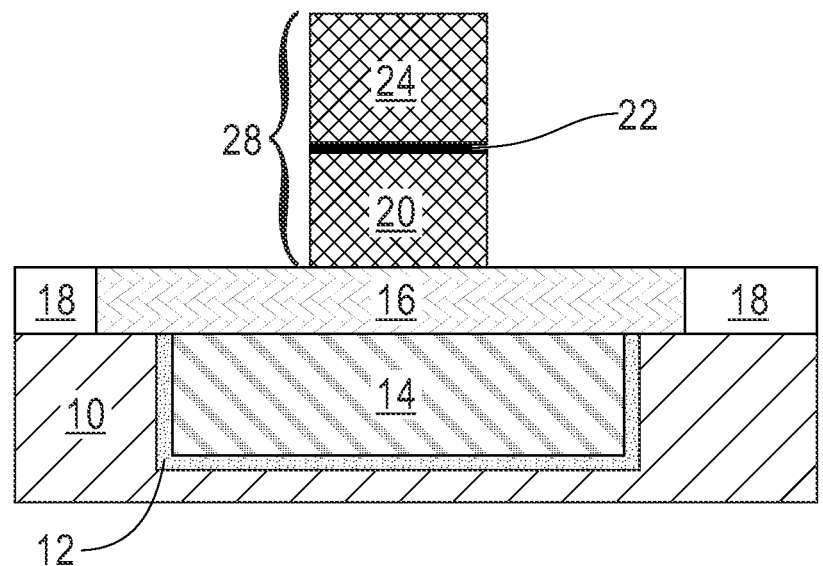
FIG. 8A is a cross sectional view of the exemplary structure of FIG. 7 after patterning the MTJ-containing material stack utilizing the patterned metal hard mask as an etch mask to provide an MTJ-containing pillar.

Referring now to FIG. 8A, there is illustrated the exemplary structure of FIG. 7 after patterning the MTJ-containing material stack 20L/22L/24L utilizing the patterned metal hard mask 26 as an etch mask to provide an MTJ-containing pillar 28. As mentioned above, the patterned metal hard mask 26 is removed during this step of the present application. In this embodiment, ion beam etching, reactive ion etching, or any other like etching process can be used to remove the MTJ-containing material stack 20L/22L/24L that is not protected by the patterned metal hard mask 26.

The portions of the blanket layers (i.e., layers 20L/22L/24L) of the MTJ-containing material stack provide MTJ-containing pillars 28 that include, from bottom to top, a magnetic pinned layer 20 (i.e., a remaining, unetched portion of the blanket layer of magnetic pinned material 20L), a tunnel barrier layer 22 (i.e., a remaining, unetched portion of the blanket layer of tunnel barrier material 22L), and a magnetic free layer 24 (i.e., a remaining, unetched portion of the blanket layer of magnetic free material 24L). In another example (not shown), each MTJ-containing pillar includes, from bottom to top, a magnetic free layer 24, a tunnel barrier layer 22, and a magnetic pinned layer 20. The MTJ-containing pillar 28 can include remaining portions of any other blanket layer that is present in the MTJ-containing material stack. The MTJ-containing pillar 28 can be cylindrical in shape; although other asymmetric shapes are possible and can be used in the present application as the shape of the MTJ-containing pillar 28. The CD of the MTJ-containing pillar 28 can vary and is not critical in the present application.

Figure 8B:
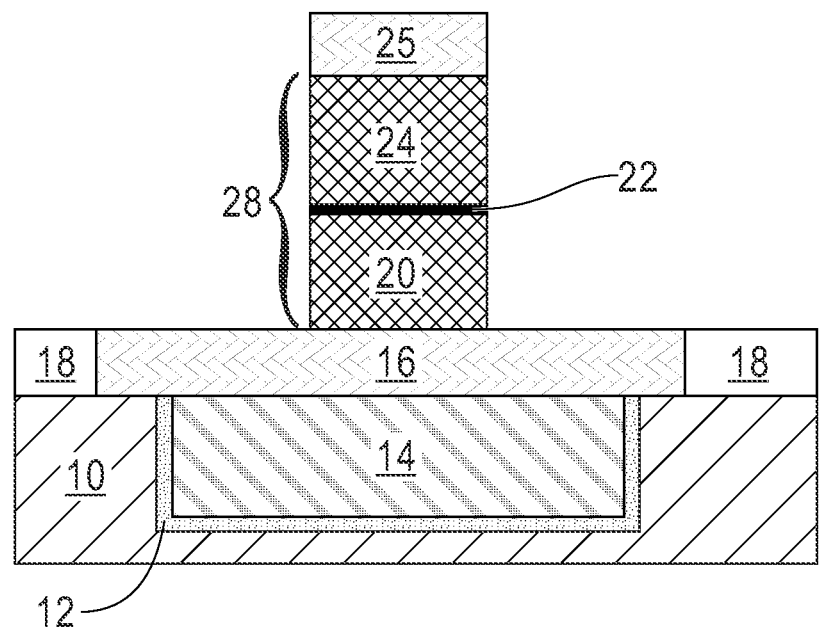
FIG. 8B is a cross sectional view of the exemplary structure of FIG. 6B after patterning the MTJ-containing material stack to provide an MTJ-containing pillar.

Referring now to FIG. 8B, there is illustrated the exemplary structure of FIG. 6B after patterning the MTJ-containing material stack 20L/22L/24L/25L to provide an MTJ-containing pillar 28 that is topped with a top electrode 25. In this embodiment, photolithographic resist stack not shown is formed upon the blanket layer of conductive electrode material 25L. The photolithographic resist stack can be composed of a material stack of a bottom organic layer, a middle inorganic layer and a top resist layer. The bottom organic layer of the photolithographic resist stack can include an organic planarization layer (OPL). The bottom organic layer of the photolithographic resist stack can include a spun-on organic layer such as, for example, a Near Frictionless Carbon (NFC), a diamond-like carbon, a thermosetting polyarylene ether or polyimide. The middle inorganic layer of the photolithographic resist stack can include any oxide layer such as, for example, a low temperature (e.g., less than or equal to 250° C.) CVD oxide, an oxide derived from TEOS (tetraethylorthosilicate), a silicon oxide, a silane oxide, or a Si-containing anti-reflection coating material (SiARC). The top resist layer of the photolithographic resist stack can be composed of a resist material that provides for high resolution lithography patterning. The photolithographic resist stack can be formed be first providing a utilizing a series of deposition processes including first spin-on coating of the bottom organic layer, second spin-on coating of the middle inorganic layer, and third spin-on coating of the top resist layer. After providing the photolithographic resist stack, the top resist layer is patterned by photolithography (i.e., exposing the top resist layer to a pattern of irradiation and then developing the exposed top resist layer), and thereafter the pattern provided to the top resist layer is transferred into the underlying layers of the photolithographic resist stack providing patterned mask. The transferring can include one or more etching processes.

In some embodiments, patterning can include first patterning the blanket layer of conductive electrode material 25L utilizing a first etching process such as, for example, a reactive ion etch, utilizing the patterned photolithographic resist stack described above as an etch mask. The remaining, i.e., non-patterned, portion of the blanket layer of conductive electrode material 25L provides a top electrode 25. The top electrode 25 can be cylindrical in shape; although other asymmetric shapes are possible and can be used in the present application as the shape of the top electrode 25. The CD of the top electrode 25 can vary and is not critical in the present application.

After patterning the blanket layer of conductive electrode material 25L, the patterned photolithographic resist stack is removed from the top electrode 25 that is formed utilizing conventional processes well-known to those skilled in the art. The patterning of the remaining blanket layers (i.e., blanket layers 20L/22L/24L) of the MTJ-containing material stack is then performed utilizing an ion beam etch or reactive ion etch in which the top electrode 25 is employed as a patterned mask. The non-patterned portions of the remaining blanket layers (i.e., layers 20L/22L/24L) of the MTJ-containing material stack provide a MTJ-containing pillar 28 that include, from bottom to top, a magnetic pinned layer 20 (i.e., a remaining, unetched portion of the blanket layer of magnetic pinned material 20L), a tunnel barrier layer 22 (i.e., a remaining, unetched portion of the blanket layer of tunnel barrier material 22L), and a magnetic free layer 24 (i.e., a remaining, unetched portion of the blanket layer of magnetic free material 24L). In another example (not shown), the MTJ-containing pillar includes, from bottom to top, a magnetic free layer 24, a tunnel barrier layer 22, and a magnetic pinned layer 20. The MTJ-containing pillar 28 can include remaining portions of any other blanket layer that is present in the MTJ-containing material stack.

The MTJ-containing pillar 28 can be cylindrical in shape; although other asymmetric shapes are possible and can be used in the present application as the shape of the MTJ-containing pillar 28; the MTJ-containing pillar 28 and the top electrode 25, which provide an MTJ-containing structure, have a same shape. The CD of the MTJ-containing pillar 28 formed in this embodiment can vary and is not critical in the present application. The CD of the MTJ-containing pillar 28 is typically the same as the CD of the top electrode 25.

It is noted that in the embodiments shown in FIGS. 8A and 8B, deposition of re-sputtered bottom metal particles onto the sidewall of the MTJ-containing pillar 28 is avoided since no bottom electrode metal is present in the structure. It is further noted that the further processing steps of the present application will be described and illustrated using only the exemplary structure shown in FIG. 8A. Although the further processing steps of the present application are described and illustrated using only the exemplary structure shown in FIG. 8A, the same processing steps can be employed using the exemplary structure shown in FIG. 8B.

Figure 9:
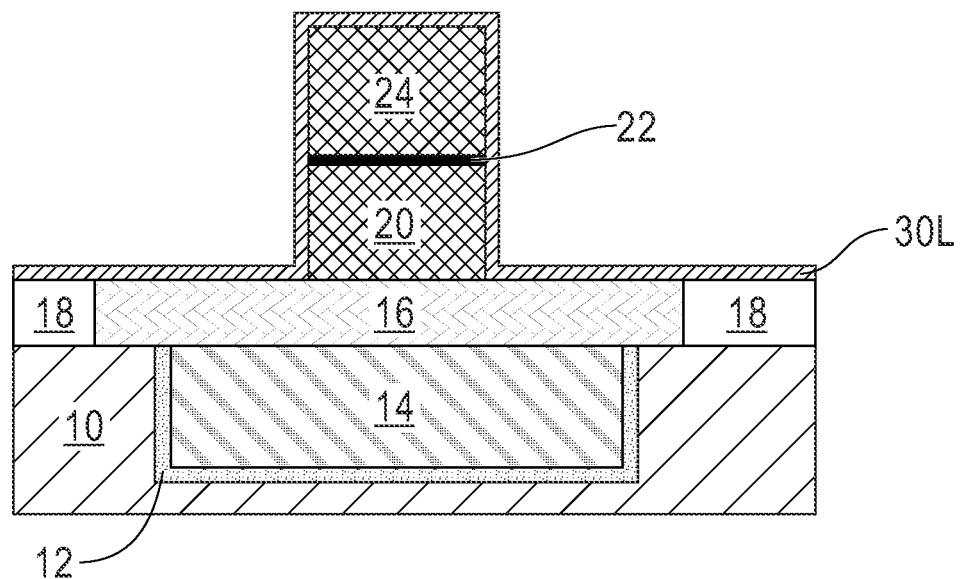
FIG. 9 is a cross sectional view of the exemplary structure of FIG. 8A after forming a conformal layer of dielectric cap material on physically exposed surfaces of the MTJ-containing pillar, the dielectric fill structure, and the sacrificial material-containing structure.

Referring now to FIG. 9, there is illustrated the exemplary structure of FIG. 8A after forming a conformal layer of dielectric cap material 30L on physically exposed surfaces of the MTJ-containing pillar 28, the dielectric fill structure 18, and the sacrificial material-containing structure 16. As used herein, the term "conformal layer" denotes that a material layer has a vertical thickness along horizontal surfaces that is substantially the same (i.e., within ±5%) as the lateral thickness along vertical surfaces.

The conformal layer of dielectric cap material 30L is composed of a dielectric capping material. The dielectric capping material that provides the conformal layer of dielectric cap material 30L is compositionally different from the dielectric materials that provide both the dielectric fill structure 18, and the sacrificial material-containing structure 16. In some embodiments, the dielectric capping material can provide passivation to the MTJ-containing pillar 28 and optional top electrode 25. In one embodiment, the conformal layer of dielectric cap material 30L is composed of silicon nitride. In another embodiment, the conformal layer of dielectric cap material 30L can be composed of a dielectric capping material that contains atoms of silicon, carbon and hydrogen. In some embodiments, and in addition to atoms of carbon and hydrogen, the dielectric capping material can include atoms of at least one of nitrogen and oxygen. In other embodiments, and in addition to atoms of silicon, nitrogen, carbon and hydrogen, the dielectric capping material can include atoms of boron. In one example, the capping material can be composed of an nBLOK dielectric material that contains atoms of silicon, carbon, hydrogen, nitrogen and oxygen. In alternative example, the dielectric capping material can be composed of a SiBCN dielectric material that contains atoms of silicon, boron, carbon, hydrogen, and nitrogen.

The conformal layer of dielectric capping material 30L can be formed by a conformal deposition process, including but not limited to, atomic layer deposition (ALD), CVD, PECVD or PVD. The conformal layer of dielectric capping material 30L can have a thickness from 10 nm to 100 nm, although lesser and greater thicknesses can also be employed.

Figure 10:
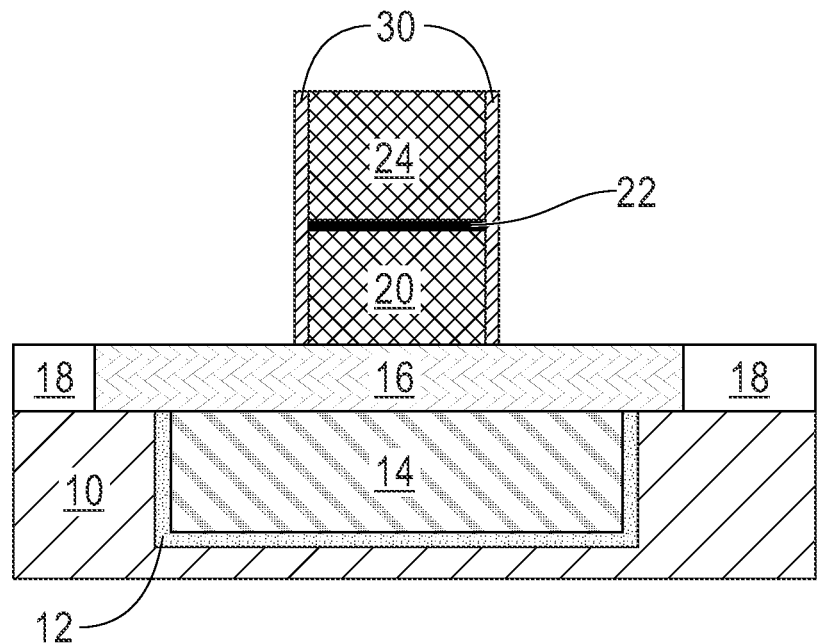
FIG. 10 is a cross sectional view of the exemplary structure of FIG. 9 after removing the conformal layer of dielectric cap material from all horizontal surfaces, while maintaining the conformal layer of dielectric cap material along the sidewall of the MTJ-containing pillar.

Referring now to FIG. 10, there is illustrated the exemplary structure of FIG. 9 after removing the conformal layer of dielectric cap material 30L from all horizontal surfaces, while maintaining the conformal layer of dielectric cap material 30L along the sidewall of the MTJ-containing pillar 28 and, if present, the top electrode 25. The remaining conformal layer of dielectric cap material 30L that is present along the sidewall of the MTJ-containing pillar 28 and, if present, the sidewall of the top electrode 25 can be referred to herein as dielectric spacer 30. Dielectric spacer 30 is pillar shaped and laterally surrounds the MTJ-containing pillar 28 and, if present, the top electrode 25. The removal of the conformal layer of dielectric cap material 30L from all horizontal surfaces can include a dielectric etch back process.

Figure 11:
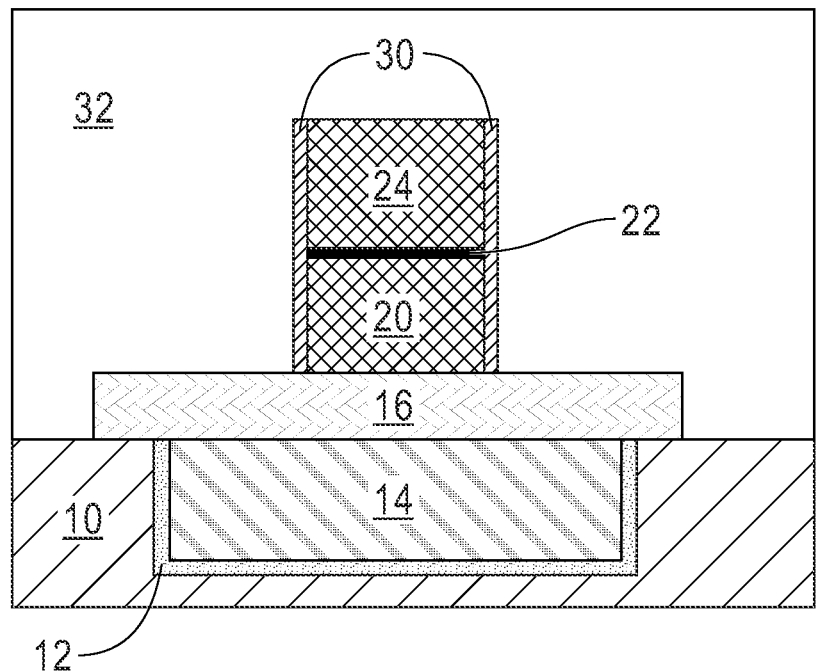
FIG. 11 is a cross sectional view of the exemplary structure of FIG. 10 after forming additional dielectric fill material.

Referring now to FIG. 11, there is illustrated the exemplary structure of FIG. 10 after forming additional dielectric fill material. The additional dielectric fill material is composed of a same dielectric material as the dielectric material that provides the dielectric fill structure 18. The additional dielectric fill material can be formed utilizing one of the deposition processes mentioned above for forming a layer of dielectric fill material 18L. In the drawings, the additional dielectric fill and the dielectric fill structure 18 are referred to herein as dielectric material 32. Dielectric material 32 is located laterally adjacent and atop the MTJ-containing pillar 28 and, if present, the top electrode 25.

Figure 12:
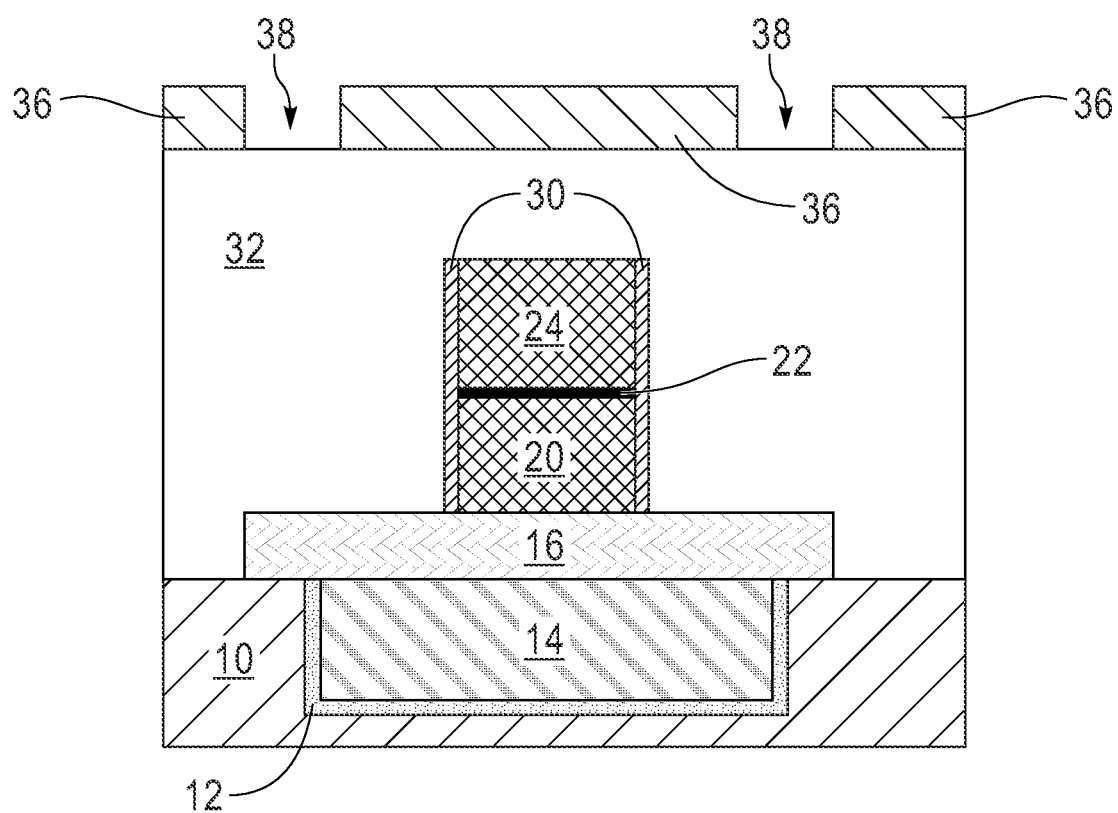
FIG. 12 is a cross sectional view of the exemplary structure of FIG. 11 after forming a patterned lithographic stack on the additional dielectric fill material, wherein the patterned lithographic stack includes an opening that is present on each side of the MTJ-containing pillar, each opening is located at an end portion of the sacrificial material-containing structure.

Referring now to FIG. 12, there is illustrated the exemplary structure of FIG. 11 after forming a patterned lithographic stack 36 on the additional dielectric fill material (i.e., dielectric material 32), wherein the patterned lithographic stack 36 includes an opening 38 that is present on each side of the MTJ-containing pillar 28 and, if present the top electrode 25, each opening 38 is located at an end portion of the sacrificial material-containing structure 16. The patterned lithographic stack 36 can include any lithographic stack including the one mentioned above for patterning the blanket layer of conductive electrode material 25L. The patterned lithographic stack 36 can be formed by deposition, lithography and, if needed, etching.

Figure 13:
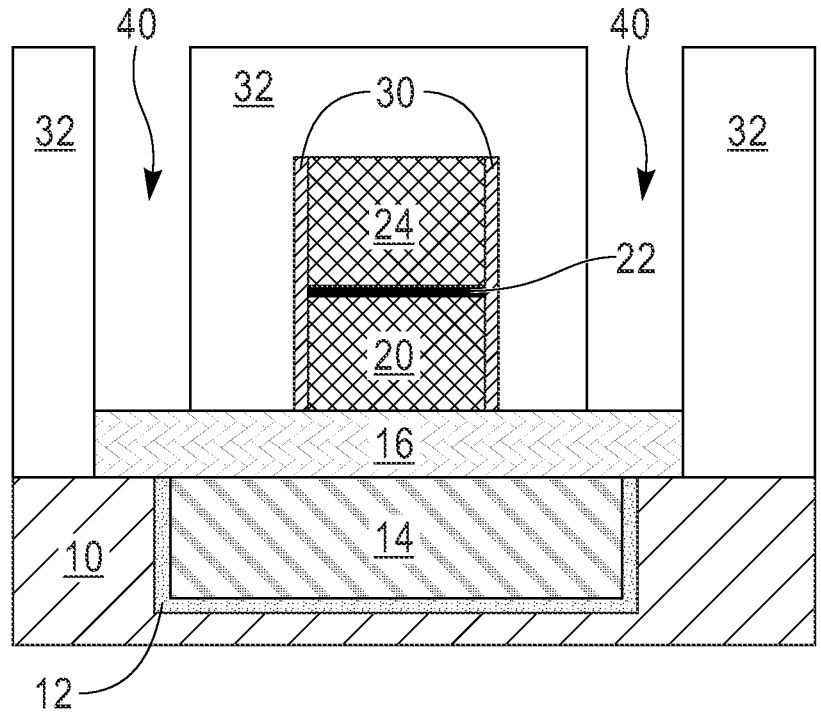
FIG. 13 is a cross sectional view of the exemplary structure of FIG. 12 after etching physically exposed portions of the additional dielectric fill material to provide vertical openings that extend down to a topmost surface of the sacrificial material-containing structure, and removing the patterned lithographic stack.

Referring now to FIG. 13, there is illustrated the exemplary structure of FIG. 12 after etching physically exposed portions of the additional dielectric fill material (i.e., dielectric material 32) to provide vertical openings 40 that extend down to a topmost surface of the sacrificial material-containing structure 16, and removing the patterned lithographic stack 36. The physically exposed portions of the additional dielectric fill material (i.e., dielectric material 32) that are not covered by the patterned lithographic stack 36 can be removed utilizing an etching process that is selective in removing the dielectric material relative to the sacrificial material-containing structure 16. In one example, a reactive ion etch (RIE) can be used to remove the physically exposed portions of the additional dielectric fill material (i.e., dielectric material 32). The patterned lithographic stack 36 can be removed utilizing a stripping process.

Figure 14:
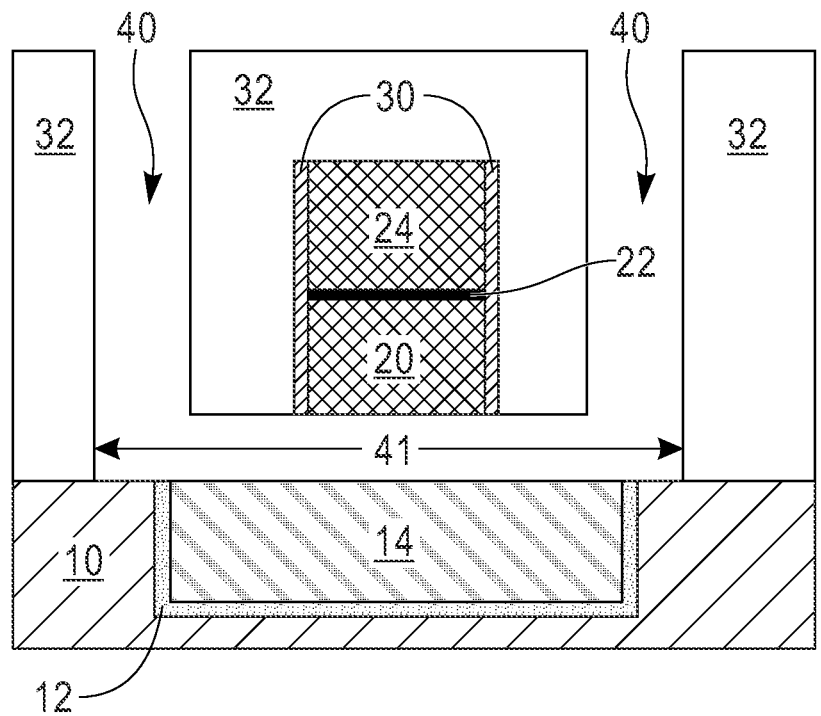
FIG. 14 is a cross sectional view of the exemplary structure of FIG. 13 after entirely removing the sacrificial material-containing structure to provide a horizontal cavity beneath the MTJ-containing pillar and atop the first electrically conductive structure, wherein the horizontal cavity is connected to each vertical opening.

Referring now to FIG. 14, there is illustrated the exemplary structure of FIG. 13 after entirely removing the sacrificial material-containing structure 16 to provide a horizontal cavity 41 beneath the MTJ-containing pillar 28 and atop the first electrically conductive structure 14, wherein the horizontal cavity 41 is connected to each vertical opening 40 to provide a continuous passage-way in the structure. The sacrificial material-containing structure 16 can be removed utilizing an etching process that is selective for removing the dielectric material that provides the sacrificial material-containing structure 16. In one embodiment, dilute hydrofluoric acid can be used to remove the sacrificial material-containing structure 16. It is noted that the MTJ-containing pillar 28 is not a free-floating structure. Instead, a portion of the dielectric material 32 that pops into and out of FIG. 14 and contacts the first ILD material layer 10 is used as an anchoring structure. Note that the sidewall of the MTJ-containing pillar is protected during this step of the present application by the dielectric material 32 and the dielectric spacer 30.

Figure 15:
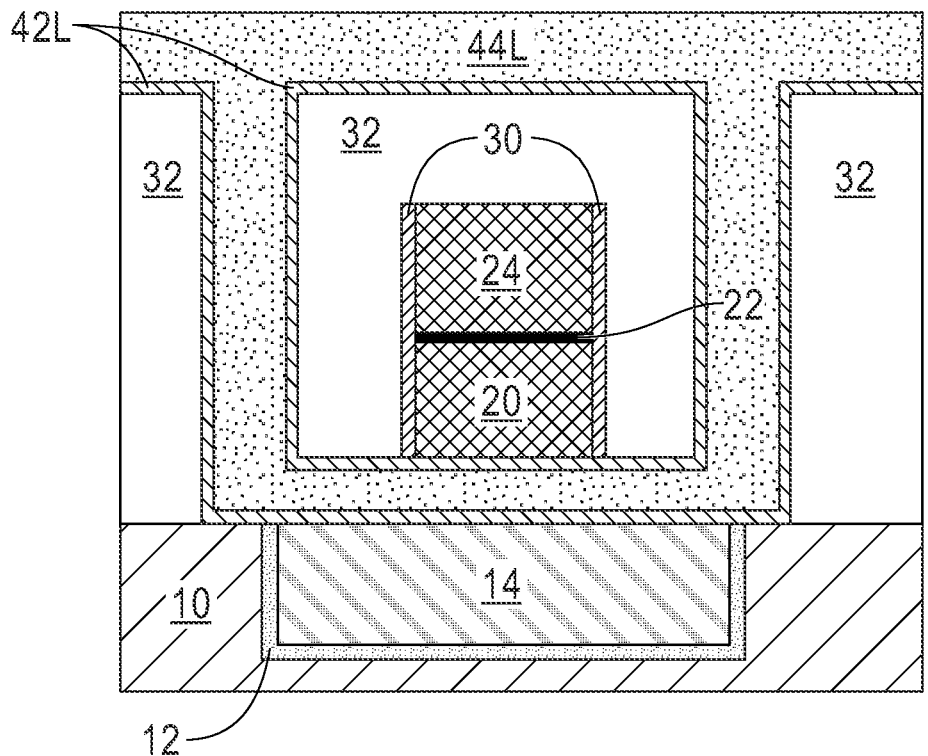
FIG. 15 is a cross sectional view of the exemplary structure of FIG. 14 after forming a conformal layer of diffusion barrier material and a layer of bottom electrode metal-containing material within the horizontal cavity and each vertical opening and atop the additional dielectric fill material.

Referring now to FIG. 15, there is illustrated the exemplary structure of FIG. 14 after forming a conformal layer of diffusion barrier material 42L and a layer of bottom electrode metal-containing material 44L within the horizontal cavity 41 and each vertical opening 40 and atop the additional dielectric fill material (i.e., dielectric material 32).

The conformal layer of diffusion barrier material 42L includes one of the diffusion barrier materials mentioned above for diffusion barrier liner 12. In one example, the conformal layer of diffusion barrier material 42L is composed of TiN. The conformal layer of diffusion barrier material 42L can be formed utilizing a conformal deposition process such as, for example, ALD, CVD, PECVD or PVD. The conformal layer of diffusion barrier material 42L can have a thickness from 1 nm to 10 nm; although other thicknesses are contemplated and can be used as long as the other thicknesses do not completely fill in the volume of the horizontal cavity 41 and each vertical opening 40. As is shown, the conformal layer of diffusion barrier material 42L lines the walls of the horizontal cavity 41 and each vertical opening 40.

The layer of bottom electrode metal-containing material 44L is composed of a conductive metal-containing material that is compositionally different from the diffusion barrier material that provides the conformal layer of diffusion barrier material 42L. The conductive metal-containing material can include one of the conductive materials mentioned above for the blanket layer of conductive electrode material 25L. The layer of bottom electrode metal-containing material 44L can be compositionally the same as, or compositionally different than, the conductive electrode material mentioned above for providing the for the blanket layer of conductive electrode material 25L. The layer of bottom electrode metal-containing material 44L can be formed utilizing a deposition process including, but not limited to, CVD, PECVD, PVD, sputtering or plating. In example embodiment, the conformal layer of diffusion barrier material 42L is composed of TiN, and the layer of bottom electrode metal-containing material 44L is composed of W.

Figure 16:
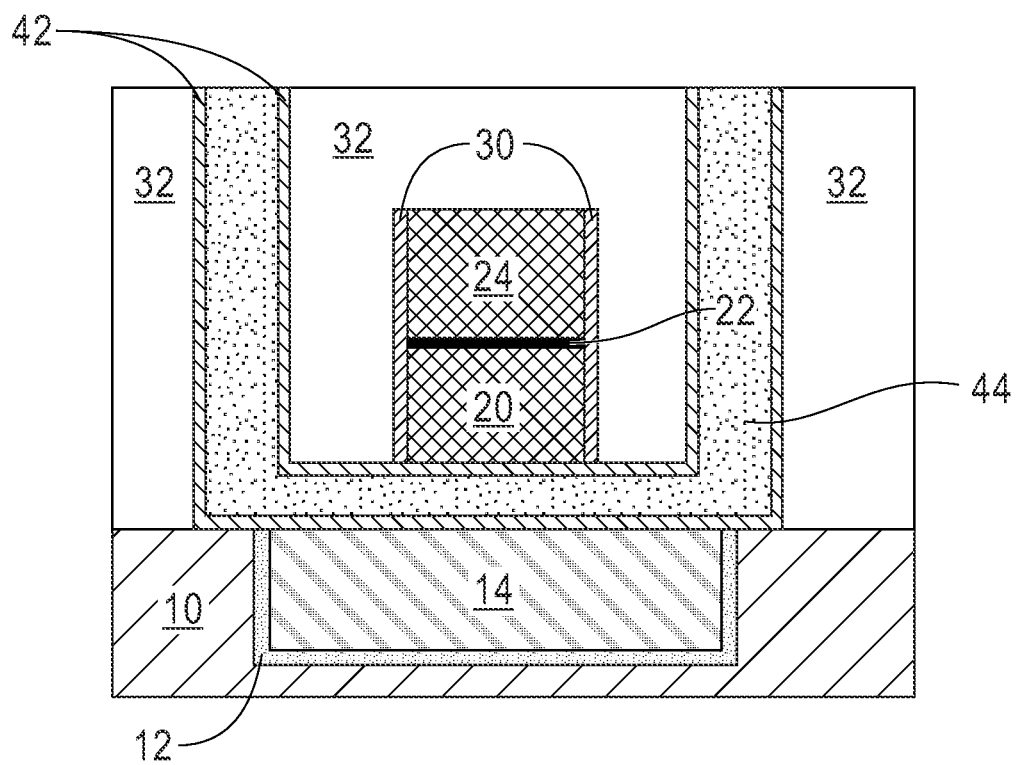
FIG. 16 is a cross sectional view of the exemplary structure of FIG. 15 after removing the conformal layer of diffusion barrier material and the layer of bottom electrode metal-containing material that are present atop the additional dielectric fill material, while maintaining the conformal layer of diffusion barrier material and the layer of bottom electrode metal-containing material within the horizontal cavity and each vertical opening.

Referring now to FIG. 16, there is illustrated the exemplary structure of FIG. 15 after removing the conformal layer of diffusion barrier material 42L and the layer of bottom electrode metal-containing material 44L that are present atop the additional dielectric fill material (i.e., dielectric material 32), while maintaining the conformal layer of diffusion barrier material 42L and the layer of bottom electrode metal-containing material 44L within the horizontal cavity 41 and each vertical opening 40. The conformal layer of diffusion barrier material 42L and the layer of bottom electrode metal-containing material 44L that are present atop the additional dielectric fill material (i.e., dielectric material 32) can be removed utilizing a planarization process such as, for example, chemical mechanical polishing.

The conformal layer of diffusion barrier material 42L that remains within the horizontal cavity 41 and each vertical opening 40 can be referred to as a bottom electrode diffusion pre-liner 42, and the layer of bottom electrode metal-containing material 44L that remains within the horizontal cavity 41 and each vertical opening 40 can be referred to as a replacement bottom electrode pre-structure 44. The bottom electrode diffusion pre-liner 42 has a topmost surface that is coplanar with a topmost surface of both the replacement bottom electrode pre-structure 44 and the dielectric material 32.

Figure 17:
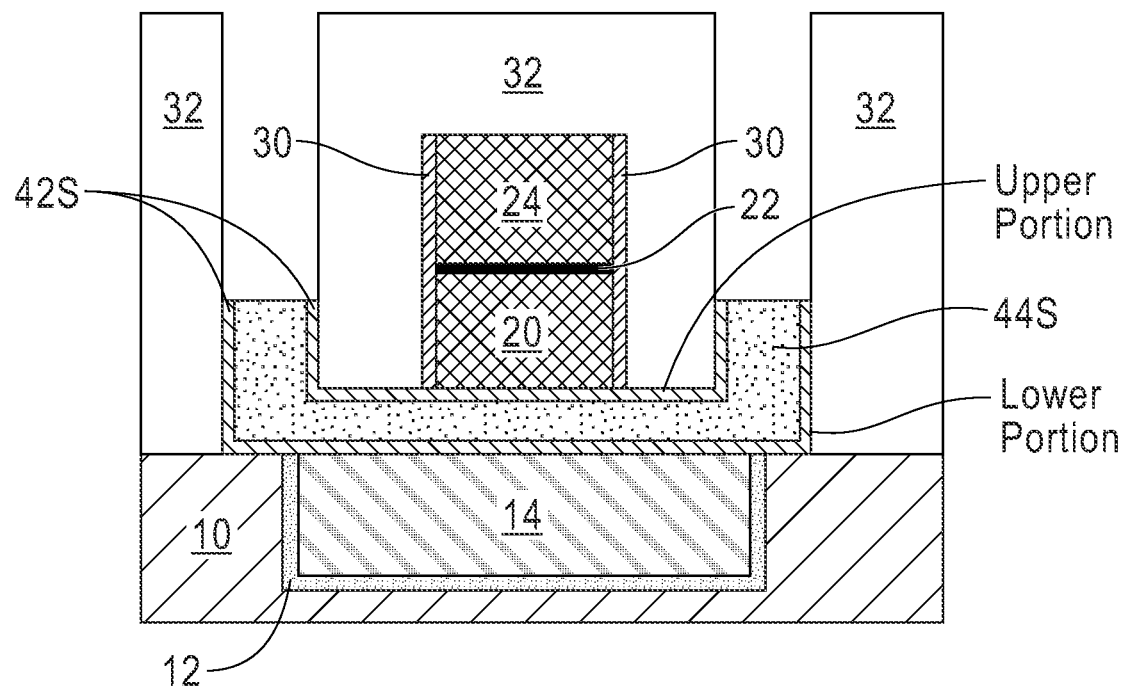
FIG. 17 is a cross sectional view of the exemplary structure of FIG. 16 after removing the maintained portions of both the conformal layer of diffusion barrier material and the layer of bottom electrode metal-containing material from an upper portion of each vertical opening.

Referring now to FIG. 17, there is illustrated the exemplary structure of FIG. 16 after removing the maintained portions of both the conformal layer of diffusion barrier material 42L (i.e., bottom electrode diffusion pre-liner 42) and the layer of bottom electrode metal-containing material 44L (i.e., the replacement bottom electrode pre-structure 44) from the upper portion of each vertical opening 40. The removal of the maintained portions of both the conformal layer of diffusion barrier material 42L (i.e., bottom electrode diffusion pre-liner 42) and the layer of bottom electrode metal-containing material 44L (i.e., the replacement bottom electrode pre-structure 44) from an upper portion of each vertical opening 40 can include one or more metal wet etching processes.

After this removal step, a portion of the bottom electrode diffusion pre-liner 42 and a portion of the replacement bottom electrode pre-structure 44 remain in a lower portion of each vertical opening 40 and the horizontal cavity 41. The remaining bottom electrode diffusion pre-liner 42 can be referred to as a bottom electrode diffusion liner 42S, and the remaining replacement bottom electrode pre-structure 44 can be referred to as a replacement bottom electrode structure 44S. The bottom electrode diffusion liner 42S has a topmost surface that is coplanar with a topmost surface of the bottom replacement bottom electrode structure 44S. It is noted that the bottom electrode diffusion liner 42S lines an entirety of the bottom replacement bottom electrode structure 44S except for the topmost surface of each vertical extending portion of the bottom replacement bottom electrode structure 44S.

As is shown in FIG. 17, the bottom electrode diffusion liner 42S has a lower portion and an upper portion which are both U-shaped. By U-shaped it is meant that a material or structure includes a vertical extending portion located at each end of a horizontal portion. The vertical extending portions of the upper and lower portions of the bottom electrode diffusion liner 42S are located laterally adjacent to the MTJ-containing pillar 28, while the horizontal portion of both the upper and lower portions of the bottom electrode diffusion liner 42S is located beneath the MTJ-containing pillar 28. The height of the vertical extending portions of both the upper and lower portions of the bottom electrode diffusion liner 42S is lower than a height of the MTJ-containing pillar 28.

As is also shown in FIG. 17, the replacement bottom electrode structure 44S is U-shaped and thus the replacement bottom electrode structure 44S has a vertical extending portion that is located at each end of a horizontal portion. The vertical extending portions of replacement bottom electrode structure 44S are located laterally adjacent to the MTJ-containing pillar 28, while at least a portion of the horizontal portion of the replacement bottom electrode structure 44S is located beneath the MTJ-containing pillar 28. The height of the vertical extending portions of the replacement bottom electrode structure 44S is lower than a height of the MTJ-containing pillar 28.

In this embodiment, the bottom electrode diffusion barrier liner 42S has an upper portion lining an upper surface of the replacement bottom electrode structure 44S and a lower portion lining a lower surface of the replacement bottom electrode structure 44S. As mentioned above, the lower portion and the upper portion of the bottom electrode diffusion barrier liner 44S are U-shaped.

Figure 18:
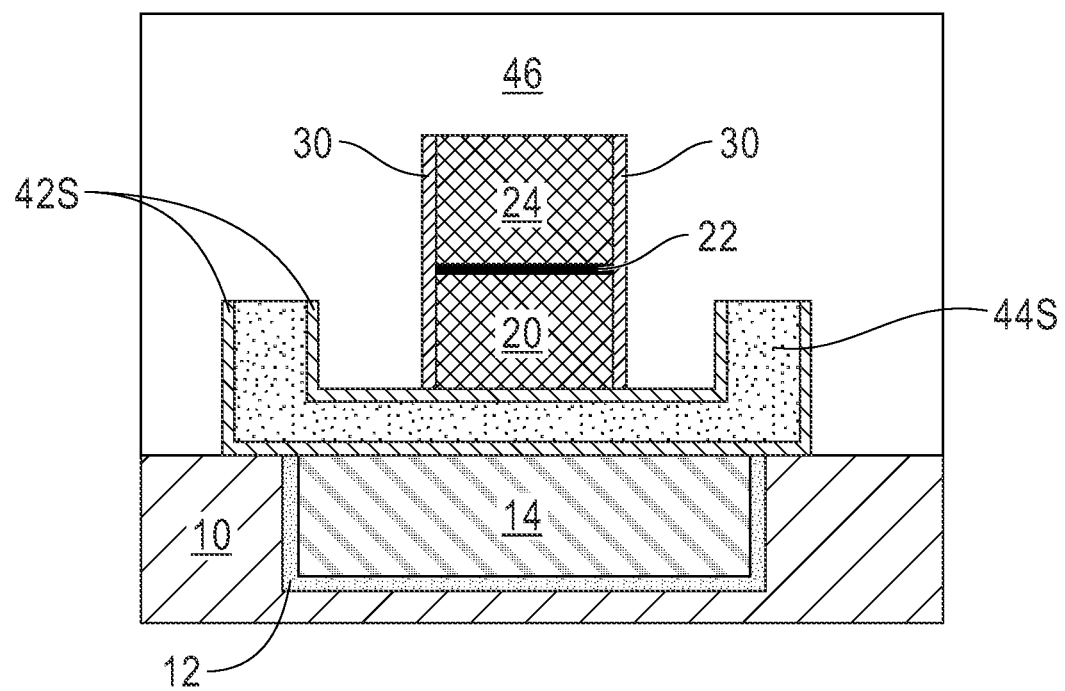
FIG. 18 is a cross sectional view of the exemplary structure of FIG. 17 after forming additional dielectric fill material within the remaining volume of each vertical opening.

Referring now to FIG. 18, there is illustrated the exemplary structure of FIG. 17 after forming additional dielectric fill material within the remaining volume of each vertical opening 40. The forming of the additional dielectric fill material within the remaining volume of each vertical opening 40 includes deposition of a dielectric fill material as defined above, followed by planarization. The additional dielectric fill is composed of a dielectric material that is compositional same as the dielectric material 32 (i.e., the layer of dielectric fill material 18L and the additional dielectric material used to provide dielectric material 32). Collectively, the dielectric material 32 and the additional dielectric fill material used at this point of the present application provide a second ILD material layer 46. The second ILD material layer 46 is located laterally adjacent to, and atop, the MTJ-containing pillar 28 as well as the vertical extending portions of both the bottom electrode diffusion liner 42S and the replacement bottom electrode structure 44S.

Figure 19:
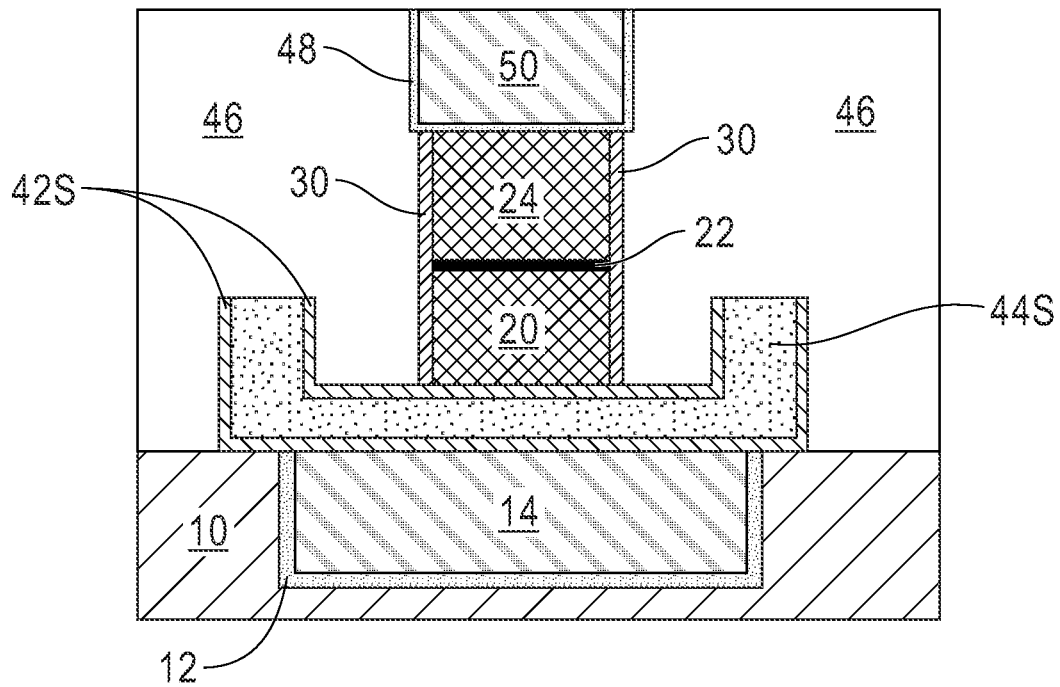
FIG. 19 is a cross sectional view of the exemplary structure of FIG. 18 after forming at least a second electrically conductive structure atop the MTJ-containing pillar.

Referring now to FIG. 19, there is illustrated the exemplary structure of FIG. 18 after forming at least a second electrically conductive structure 50 atop the MTJ-containing pillar 28; FIG. 19 represents a first memory structure in accordance with the present application. The second electrically conductive structure 50 is in electrical connection with the MTJ-containing pillar 28. In some embodiments, a diffusion barrier liner 48, which is U-shaped, can be present along the sidewalls and the bottom wall of the second electrically conductive structure 50. In some embodiments, the diffusion barrier liner 48 can be omitted. The second electrically conductive structure 50 has a topmost surface that is coplanar with a topmost surface of the second ILD material 46 and, if present, a topmost surface of the diffusion barrier liner 48.

The optional diffusion barrier liner 48 and the second electrically conductive structure 50 can be formed utilizing a damascene process as mentioned above for forming the optional diffusion barrier liner 12 and the first electrically conductive structure 14. When present, the diffusion barrier liner 48 can include one of the diffusion barrier materials mentioned above for diffusion barrier liner 12. The second electrically conductive structure 50 can include one of the electrically conductive materials mentioned above for the first electrically conductive structure 14. The second electrically conductive structure 50 can have a CD that is equal to, less than, or greater than, the CD of the MTJ-containing pillar 28.

Figure 20:
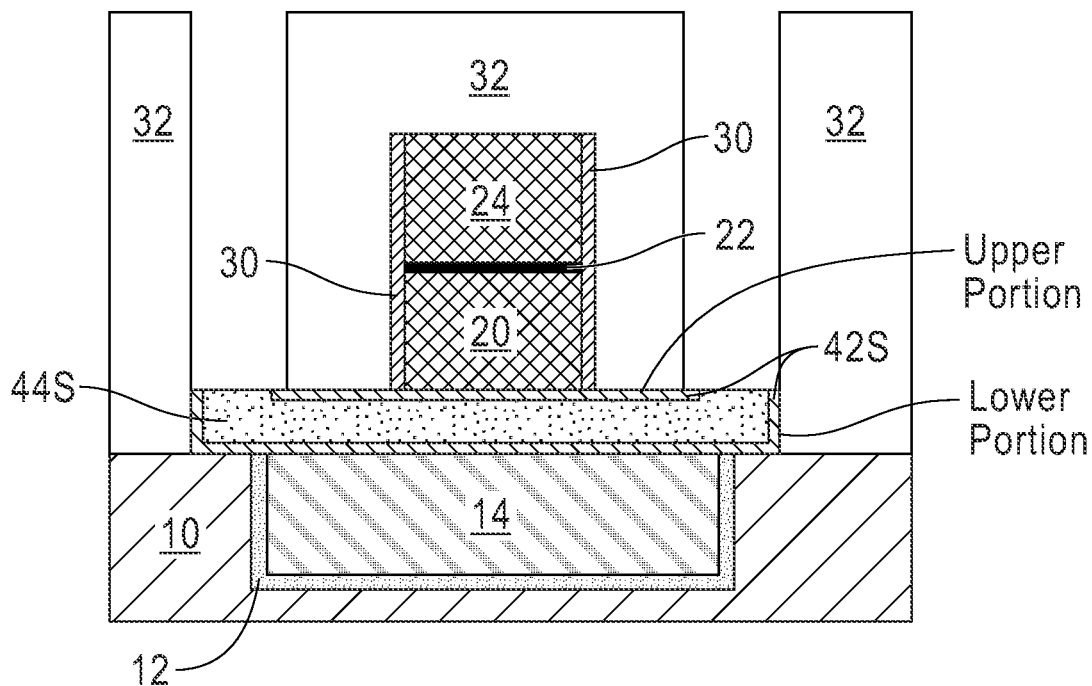
FIG. 20 is a cross sectional view of the exemplary structure of FIG. 16 after removing the maintained portions of both the conformal layer of diffusion barrier material and the layer of bottom electrode metal-containing material from each vertical opening.

Referring now to FIG. 20, there is illustrated the exemplary structure of FIG. 16 after removing the maintained portions of both the conformal layer of diffusion barrier material 42L (i.e., the bottom electrode diffusion pre-liner 42) and the layer of bottom electrode metal-containing material 44L (i.e., the replacement bottom electrode pre-structure 44) from each vertical opening 40, but not the horizontal cavity 41. The removal of the maintained portions of both the conformal layer of diffusion barrier material 42L (i.e., bottom electrode diffusion pre-liner 42) and the layer of bottom electrode metal-containing material 44L (i.e., the replacement bottom electrode pre-structure 44) from each vertical opening 40 can include one or more metal wet etching processes.

After this removal step, a portion of the bottom electrode diffusion pre-liner 42 and a portion of the replacement bottom electrode pre-structure 44 remain in the horizontal cavity 41. The remaining bottom electrode diffusion pre-liner 42 can be referred to as a bottom electrode diffusion liner 42S, and the remaining replacement bottom electrode pre-structure 44 can be referred to as a replacement bottom electrode structure 44S. The bottom electrode diffusion liner 42S has a topmost surface that is coplanar with a topmost surface of the bottom replacement bottom electrode structure 44S. It is noted that the bottom electrode diffusion liner 42S lines an entirety of the bottom replacement bottom electrode structure 44S except for a topmost surface that is physically exposed by each of the vertical openings 40. The bottom electrode diffusion liner 42S and the bottom replacement bottom electrode structure 44S cover an entirety of the first electrically conductive structure 14.

As is shown in FIG. 20, the bottom electrode diffusion liner 42S and the bottom replacement bottom electrode structure 44S are located entirely beneath the MTJ-containing pillar 28. As is also shown in FIG. 20, the bottom electrode diffusion liner 42S has a lower portion that is U-shaped and lines the sidewalls and bottom wall of the bottom replacement bottom electrode structure 44S. The bottom electrode diffusion liner 42S also has an upper portion that is planar and is located on a topmost surface of the bottom replacement bottom electrode structure 44S.

Figure 21:
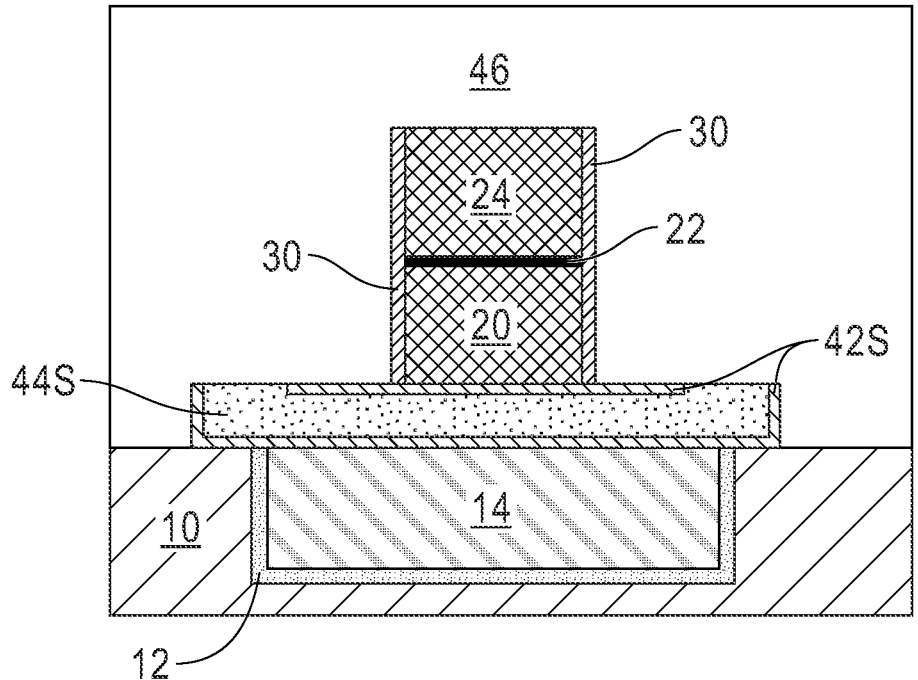
FIG. 21 is a cross sectional view of the exemplary structure of FIG. 20 after forming additional dielectric fill material within the remaining volume of each vertical opening.

Referring now to FIG. 21, there is illustrated the exemplary structure of FIG. 20 after forming additional dielectric fill material within the remaining volume of each vertical opening 40. The forming of the additional dielectric fill material within the remaining volume of each vertical opening 40 includes deposition of a dielectric fill material as defined above, followed by planarization. The additional dielectric fill is composed of a dielectric material that is compositional same as the dielectric material 32 (i.e., the layer of dielectric fill material 18L and the additional dielectric material used to provide dielectric material 32). Collectively, the dielectric material 32 and the additional dielectric fill material used at this point of the present application provide a second ILD material layer 46. The second ILD material layer 46 is located laterally adjacent to, and atop, the MTJ-containing pillar 28.

Figure 22:
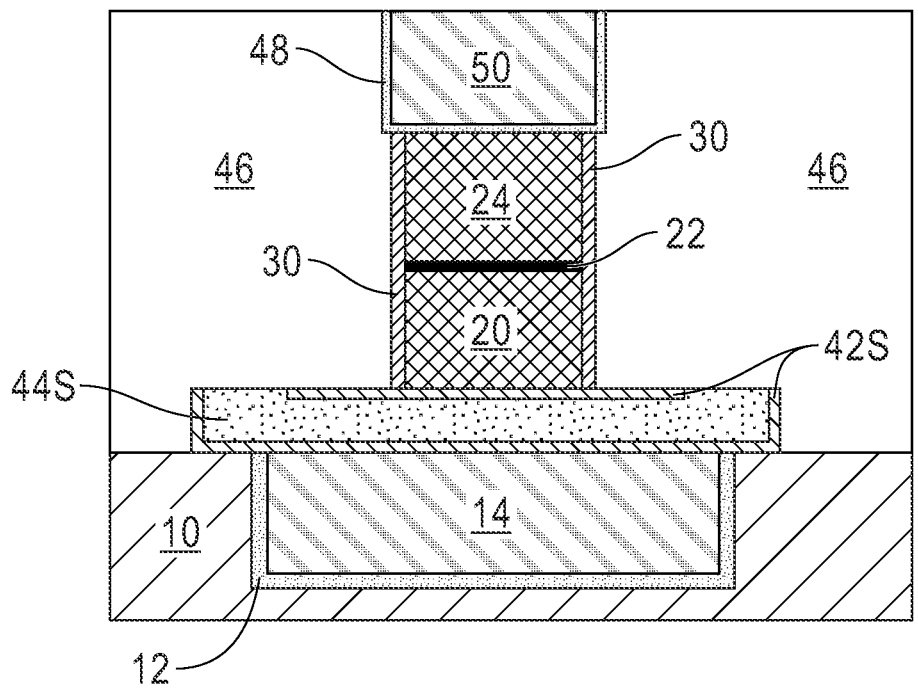
FIG. 22 is a cross sectional view of the exemplary structure of FIG. 21 after forming at least a second electrically conductive structure atop the MTJ-containing pillar.

Referring now to FIG. 22, there is illustrated the exemplary structure of FIG. 21 after forming at least a second electrically conductive structure 50 atop the MTJ-containing pillar 28; FIG. 22 represents a second memory structure in accordance with the present application. The second electrically conductive structure 50 is in electrical connection with the MTJ-containing pillar 28. In some embodiments, a diffusion barrier liner 48, which is U-shaped, can be present along the sidewalls and the bottom wall of the second electrically conductive structure 50. In some embodiments, the diffusion barrier liner 48 can be omitted. The second electrically conductive structure 50 has a topmost surface that is coplanar with a topmost surface of the second ILD material 46 and, if present, a topmost surface of the diffusion barrier liner 48.

The optional diffusion barrier liner 48 and the second electrically conductive structure 50 can be formed utilizing a damascene process as mentioned above for forming the optional diffusion barrier liner 12 and the first electrically conductive structure 14. When present, the diffusion barrier liner 48 can include one of the diffusion barrier materials mentioned above for diffusion barrier liner 12. The second electrically conductive structure 50 can include one of the electrically conductive materials mentioned above for the first electrically conductive structure 14. The second electrically conductive structure 50 can have a CD that is equal to, less than, or greater than, the CD of the MTJ-containing pillar 28.

Figure 23:
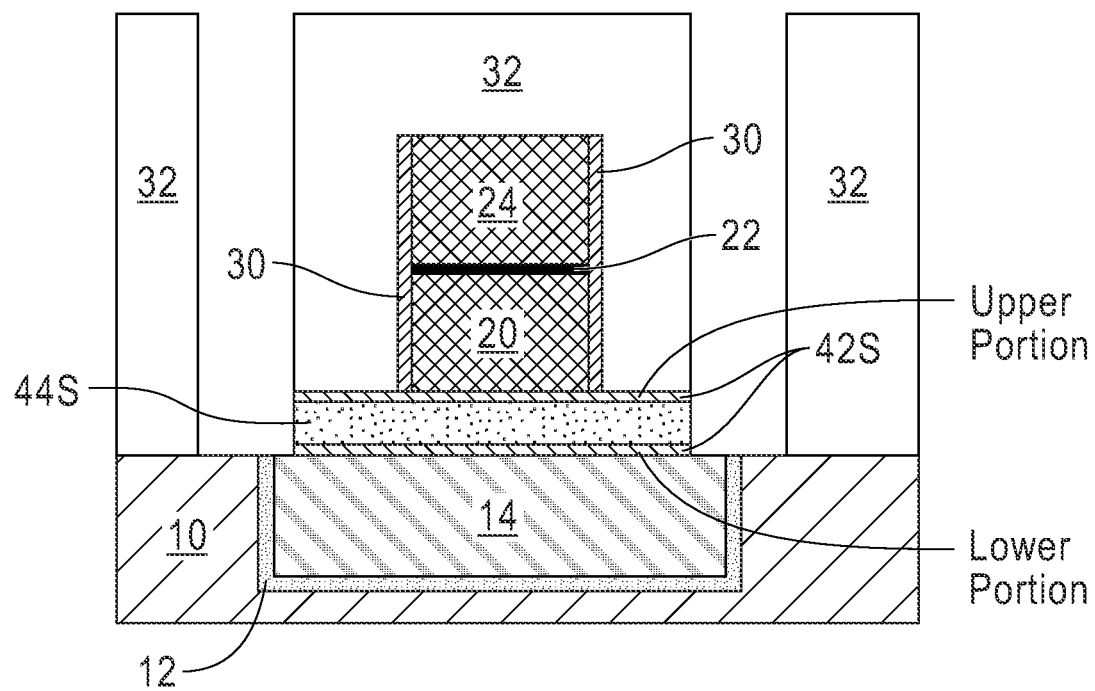
FIG. 23 is a cross sectional view of the exemplary structure of FIG. 16 after removing the maintained portions of both the conformal layer of diffusion barrier material and the layer of bottom electrode metal-containing material from each vertical opening and end portions of the horizontal cavity.

Referring now to FIG. 23, there is illustrated the exemplary structure of FIG. 16 after removing the maintained portions of both the conformal layer of diffusion barrier 42L (i.e., the bottom electrode diffusion pre-liner 42) and the layer of bottom electrode metal-containing material 44L (i.e., the replacement bottom electrode pre-structure 44 from each vertical opening 40, and end portions of the horizontal cavity 41. The removal of the maintained portions of both the conformal layer of diffusion barrier material 42L (i.e., bottom electrode diffusion pre-liner 42) and the layer of bottom electrode metal-containing material 44L (i.e., the replacement bottom electrode pre-structure 44) from each vertical opening 40 and portions of the horizontal cavity can include one or more metal wet etching processes.

After this removal step, a portion of the bottom electrode diffusion pre-liner 42 and a portion of the replacement bottom electrode pre-structure 44 remain in the horizontal cavity 41. The remaining bottom electrode diffusion pre-liner 42 can be referred to as a bottom electrode diffusion liner 42S, and the remaining replacement bottom electrode pre-structure 44 can be referred to as a replacement bottom electrode structure 44S. In this embodiment, the bottom electrode diffusion liner 42S has an upper portion and a lower portion, and the replacement bottom electrode structure 44S is sandwiched between the upper and lower portions of the bottom electrode diffusion liner 42S. As is shown in FIG. 23, the bottom electrode diffusion liner 42S and the bottom replacement bottom electrode structure 44S are located entirely beneath the MTJ-containing pillar 28. As is also shown in FIG. 23, outermost sidewall edges of the lower and upper portions of the bottom electrode diffusion liner 42S are vertically aligned to each other, and vertically aligned with the outermost sidewalls of the sandwiched bottom replacement bottom electrode structure 44S. The bottom electrode diffusion liner 42S and the bottom replacement bottom electrode structure 44S partially cover the first electrically conductive structure 14.

Figure 24:
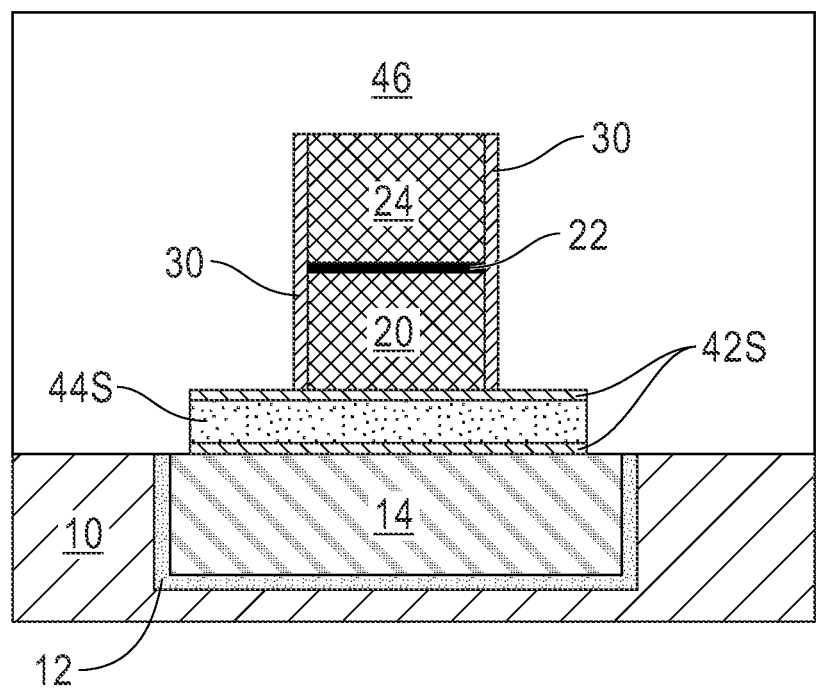
FIG. 24 is a cross sectional view of the exemplary structure of FIG. 23 after forming additional dielectric fill material within the remaining volume of each vertical opening and within the end portions of the horizontal cavity.

Referring now to FIG. 24, there is illustrated the exemplary structure of FIG. 23 after forming additional dielectric fill material within the remaining volume of each vertical opening 50 and within each end of the horizontal cavity 41. The forming of the additional dielectric fill material includes deposition of a dielectric fill material as defined above, followed by planarization. The additional dielectric fill is composed of a dielectric material that is compositional same as the dielectric material 32 (i.e., the layer of dielectric fill material 18L and the additional dielectric material used to provide dielectric material 32). Collectively, the dielectric material 32 and the additional dielectric fill material used at this point of the present application provide a second ILD material layer 46. The second ILD material layer 46 is located laterally adjacent to, and atop, the MTJ-containing pillar 28 as well as the vertical extending portions of both the bottom electrode diffusion liner 42S and the replacement bottom electrode structure 44S.

Figure 25:
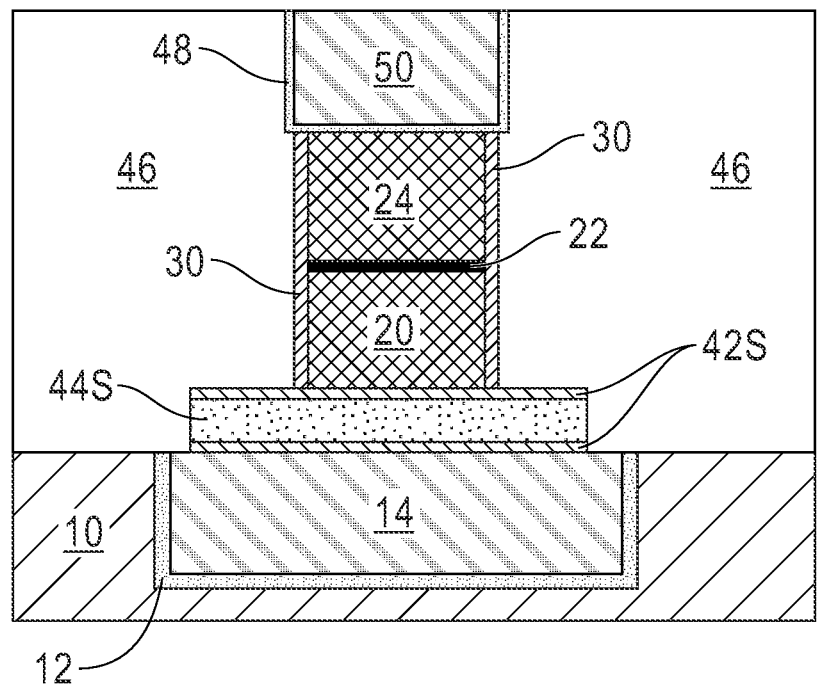
FIG. 25 is a cross sectional view of the exemplary structure of FIG. 24 after forming at least a second electrically conductive structure atop the MTJ-containing pillar.

Referring now to FIG. 25, there is illustrated the exemplary structure of FIG. 24 after forming at least a second electrically conductive structure 50 atop the MTJ-containing pillar 28; FIG. 25 represents a third memory structure in accordance with the present application. The second electrically conductive structure 50 is in electrical connection with the MTJ-containing pillar 28. In some embodiments, a diffusion barrier liner 48, which is U-shaped, can be present along the sidewalls and the bottom wall of the second electrically conductive structure 50. In some embodiments, the diffusion barrier liner 48 can be omitted. The second electrically conductive structure 50 has a topmost surface that is coplanar with a topmost surface of the second ILD material 46 and, if present, a topmost surface of the diffusion barrier liner 48.

The optional diffusion barrier liner 48 and the second electrically conductive structure 50 can be formed utilizing a damascene process as mentioned above for forming the optional diffusion barrier liner 12 and the first electrically conductive structure 14. When present, the diffusion barrier liner 48 can include one of the diffusion barrier materials mentioned above for diffusion barrier liner 12. The second electrically conductive structure 50 can include one of the electrically conductive materials mentioned above for the first electrically conductive structure 14. The second electrically conductive structure 50 can have a critical dimension that is equal to, less than, or greater than, the critical dimension of the MTJ-containing pillar 28.

Figure 26:
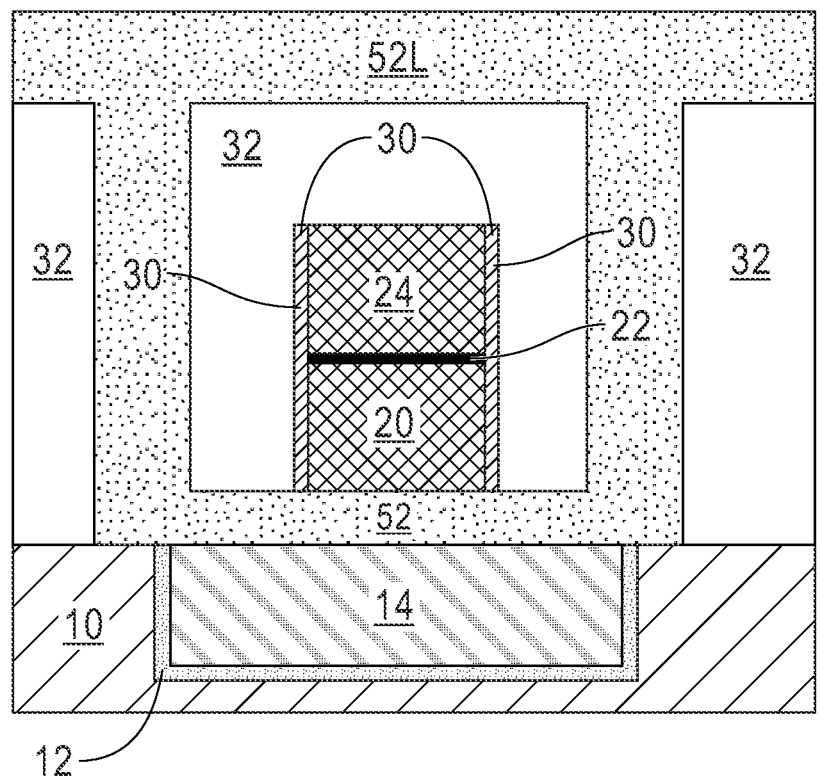
FIG. 26 is a cross sectional view of the exemplary structure of FIG. 14 after forming a layer of bottom electrode metal-containing material within the horizontal cavity and each vertical opening and atop the additional dielectric fill material.

Referring now to FIG. 26, there is illustrated the exemplary structure of FIG. 14 after forming a layer of bottom electrode metal-containing material 52L within the horizontal cavity 41 and each vertical opening 20 and atop the additional dielectric fill material (i.e., dielectric material 32). In this embodiment of the present application, the layer of bottom electrode metal-containing material 52L includes one of the conducive electrode materials mentioned above for the blanket layer of conductive electrode material 25L that provides top electrode 25. The conductive electrode material that provides the layer of conductive electrode material 25L can be compositionally the same as, or compositionally different than, the conducive electrode material that provides the blanket layer of conductive electrode material 25L. The bottom electrode metal-containing material 52L can be formed utilizing a deposition process including, ALD, CVD, PECVD, PVD, sputtering or plating.

Figure 27:
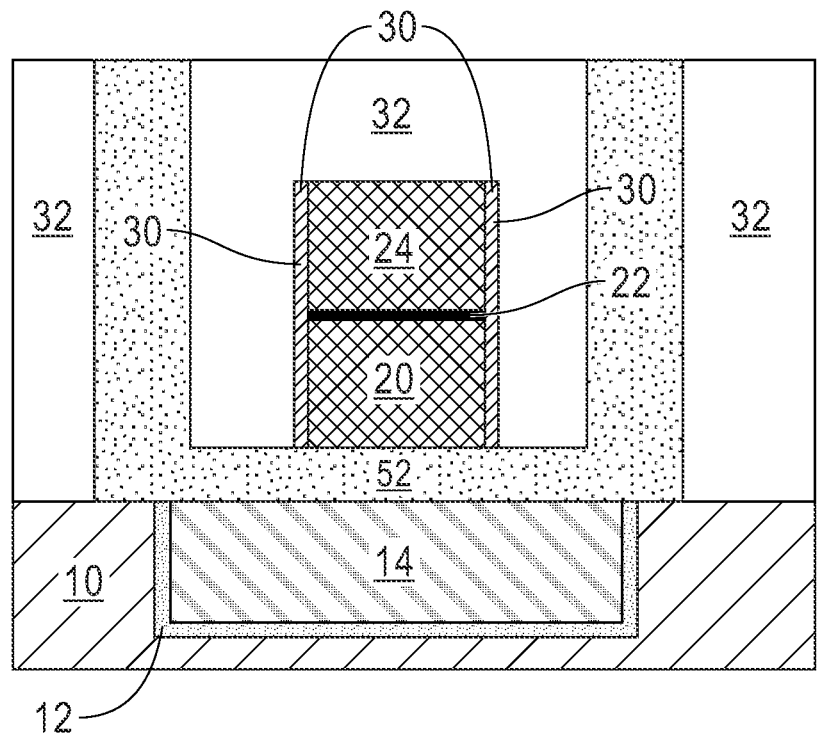
FIG. 27 is a cross sectional view of the exemplary structure of FIG. 26 after removing the layer of bottom electrode metal-containing material that is present atop the additional dielectric fill material, while maintaining the layer of bottom electrode metal-containing material within the horizontal cavity and each vertical opening.

Referring now to FIG. 27, there is illustrated the exemplary structure of FIG. 26 after removing the layer of bottom electrode metal-containing material 52L that is present atop the additional dielectric fill material (i.e., dielectric material 32), while maintaining the layer of bottom electrode metal-containing material 52L within the horizontal cavity 41 and each vertical opening 40.

The removal of the layer of bottom electrode metal-containing material 52L that is present atop the additional dielectric fill material (i.e., dielectric material 32) can be performed utilizing any material removal process including, for example, CMP. The layer of bottom electrode metal-containing material 52L within the horizontal cavity 41 and each vertical opening 40 can be referred to herein as a replacement bottom electrode pre-structure 52. The replacement bottom electrode pre-structure 52 has a topmost surface that at this point of the present application is coplanar with a topmost surface of dielectric material 32.

Figure 28:
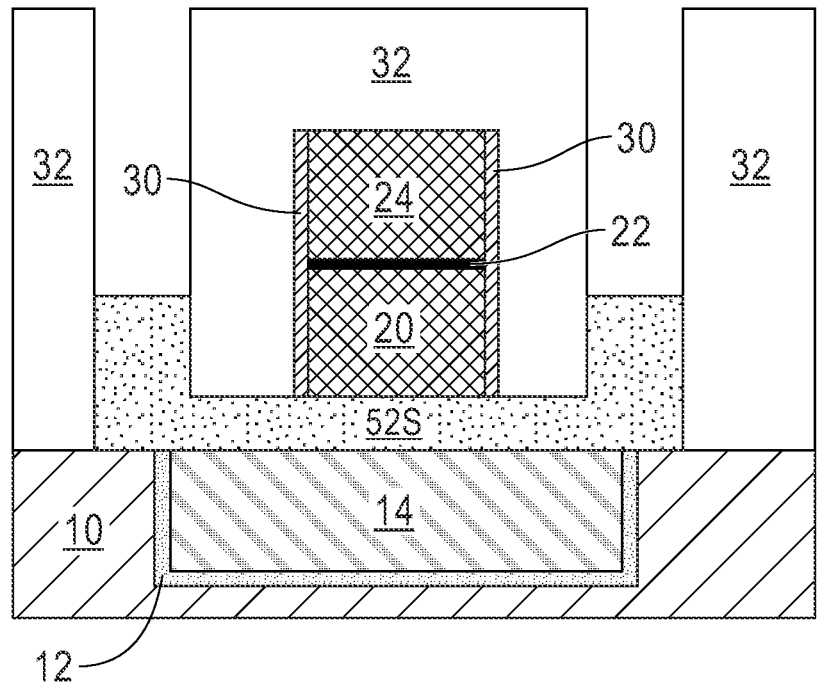
FIG. 28 is a cross sectional view of the exemplary structure of FIG. 27 after removing the maintained portion of the layer of bottom electrode metal-containing material from an upper portion of each vertical opening.

Referring now to FIG. 28, there is illustrated the exemplary structure of FIG. 27 after removing the maintained portion of the layer of bottom electrode metal-containing material 52L (i.e., the replacement bottom electrode pre-structure 52) from an upper portion of each vertical opening 40. The removal of the maintained portion of the layer of bottom electrode metal-containing material 52L (i.e., the replacement bottom electrode pre-structure 52) from the upper portion of each vertical opening 40 can include a metal wet etching process.

After this removal step, a portion of the replacement bottom electrode pre-structure 52 remains in a lower portion of each vertical opening 40 and the horizontal cavity 41. The remaining replacement bottom electrode pre-structure 52 can be referred to as a replacement bottom electrode structure 52S. As is shown in FIG. 25, the replacement bottom electrode structure 52S is U-shaped and thus the replacement bottom electrode structure 44S has a vertical extending portion that is located at each end of a horizontal portion. The vertical extending portions of replacement bottom electrode structure 52S are located laterally adjacent to the MTJ-containing pillar 28, while the horizontal portion of the replacement bottom electrode structure 52S is located beneath the MTJ-containing pillar 28. The height of the vertical extending portions of the replacement bottom electrode structure 52S is lower than a height of the MTJ-containing pillar 28.

Figure 29:
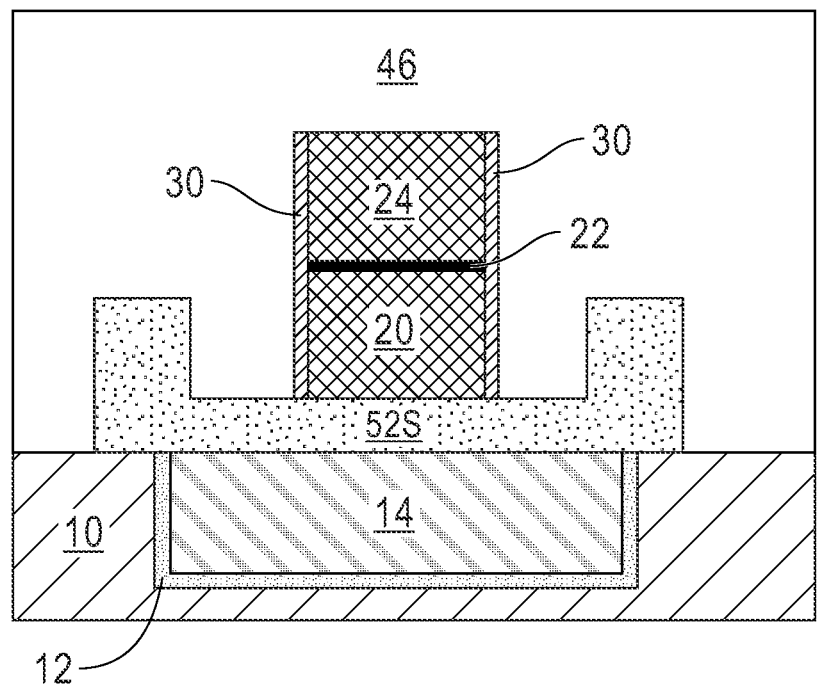
FIG. 29 is a cross sectional view of the exemplary structure of FIG. 28 after forming additional dielectric fill material within the remaining volume of each vertical opening.

Referring now to FIG. 29, there is illustrated the exemplary structure of FIG. 28 after forming additional dielectric fill material within the remaining volume of each vertical opening 50. The forming of the additional dielectric fill material includes deposition of a dielectric fill material as defined above, followed by planarization. The additional dielectric fill is composed of a dielectric material that is compositional same as the dielectric material 32 (i.e., the layer of dielectric fill material 18L and the additional dielectric material used to provide dielectric material 32). Collectively, the dielectric material 32 and the additional dielectric fill material used at this point of the present application provide a second ILD material layer 46. The second ILD material layer 46 is located laterally adjacent to, and atop, the MTJ-containing pillar 28 as well as the vertical extending portions of the replacement bottom electrode structure 52S.

Figure 30:
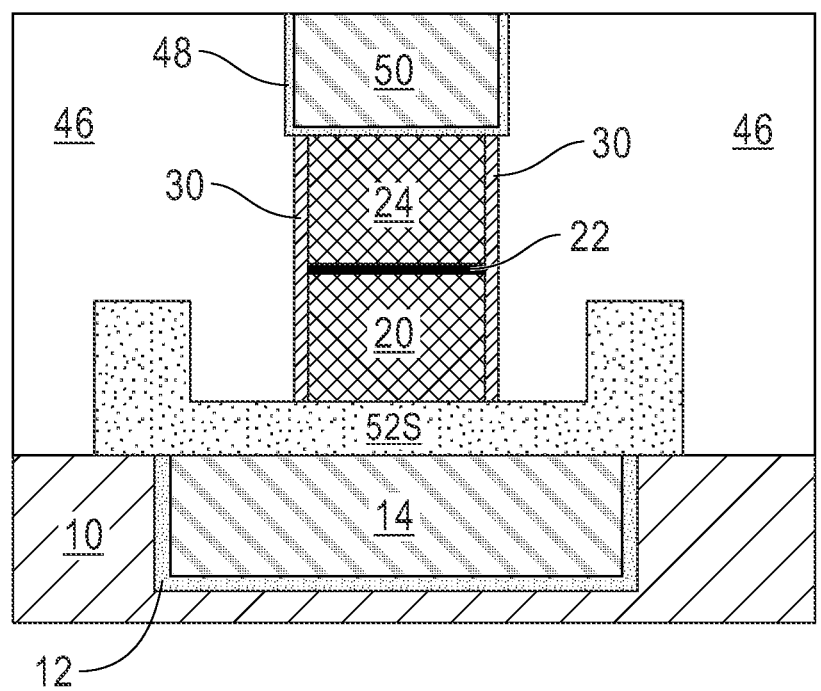
FIG. 30 is a cross sectional view of the exemplary structure of FIG. 29 after forming at least a second electrically conductive structure atop the MTJ-containing pillar.

Referring now to FIG. 30, there is illustrated the exemplary structure of FIG. 29 after forming at least a second electrically conductive structure 50 atop the MTJ-containing pillar 28; FIG. 30 represents a fourth memory structure in accordance with the present application. The second electrically conductive structure 50 is in electrical connection with the MTJ-containing pillar 28. In some embodiments, a diffusion barrier liner 48, which is U-shaped, can be present along the sidewalls and the bottom wall of the second electrically conductive structure 50. In some embodiments, the diffusion barrier liner 48 can be omitted. The second electrically conductive structure 50 has a topmost surface that is coplanar with a topmost surface of the second ILD material 46 and, if present, a topmost surface of the diffusion barrier liner 48.

The optional diffusion barrier liner 48 and the second electrically conductive structure 50 can be formed utilizing a damascene process as mentioned above for forming the optional diffusion barrier liner 12 and the first electrically conductive structure 14. When present, the diffusion barrier liner 48 can include one of the diffusion barrier materials mentioned above for diffusion barrier liner 12. The second electrically conductive structure 50 can include one of the electrically conductive materials mentioned above for the first electrically conductive structure 14. The second electrically conductive structure 50 can have a CD that is equal to, less than, or greater than, the CD of the MTJ-containing pillar 28.

Figure 31:
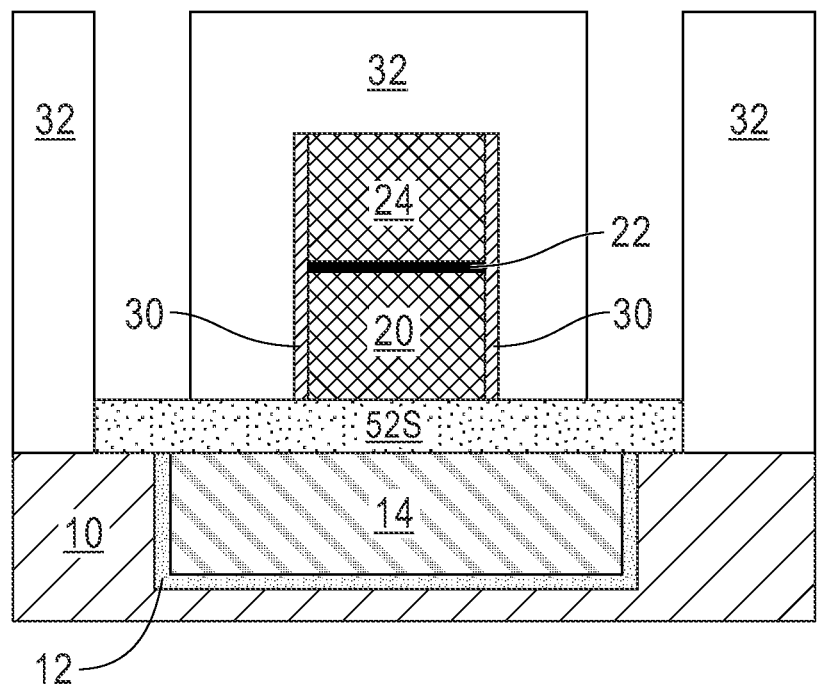
FIG. 31 is a cross sectional view of the exemplary structure of FIG. 27 after removing the maintained portion of the layer of bottom electrode metal-containing material from each vertical opening.

Referring now to FIG. 31, there is illustrated the exemplary structure of FIG. 27 after removing the maintained portion of the layer of bottom electrode metal-containing material 52L the replacement bottom electrode pre-structure 52) from each vertical opening 40. The removal of replacement bottom electrode pre-structure 52 from each vertical opening 40 can include a metal wet etching process.

As is illustrated in FIG. 31, replacement bottom electrode pre-structure 52 remains in the horizontal cavity 41. The remaining replacement bottom electrode pre-structure 52 can be referred to herein as replacement bottom electrode structure 52S. In this embodiment, the replacement bottom electrode structure 52S is located entirely beneath the MTJ-containing pillar 28 and covers an entirety of the first electrically conductive structure 14.

Figure 32:
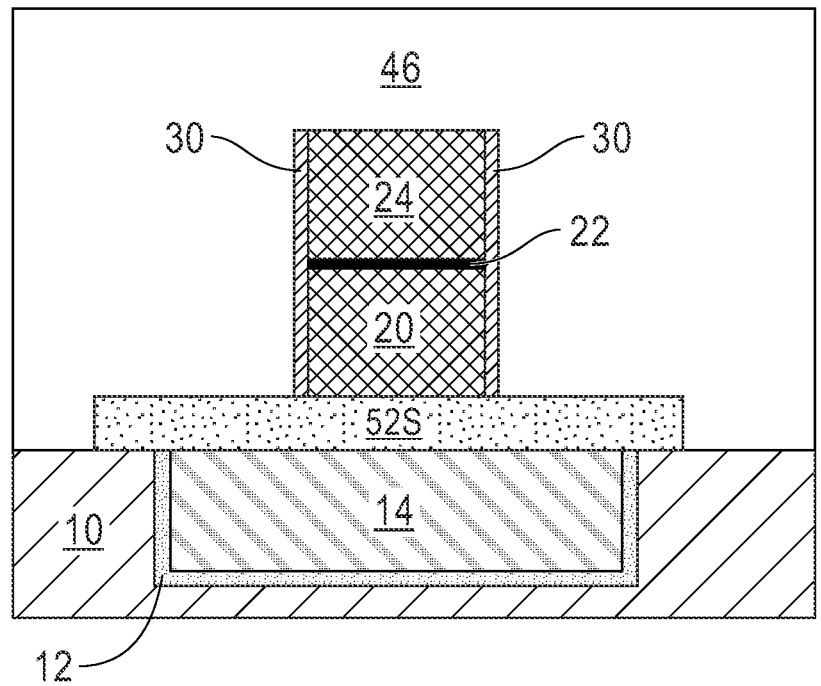
FIG. 32 is a cross sectional view of the exemplary structure of FIG. 31 after forming additional dielectric fill material within the remaining volume of each vertical opening.

Referring now to FIG. 32, there is illustrated the exemplary structure of FIG. 31 after forming additional dielectric fill material within the remaining volume of each vertical opening 50. The forming of the additional dielectric fill material includes deposition of a dielectric fill material as defined above, followed by planarization. The additional dielectric fill is composed of a dielectric material that is compositional same as the dielectric material 32 (i.e., the layer of dielectric fill material 18L and the additional dielectric material used to provide dielectric material 32). Collectively, the dielectric material 32 and the additional dielectric fill material used at this point of the present application provide a second ILD material layer 46.

Figure 33:
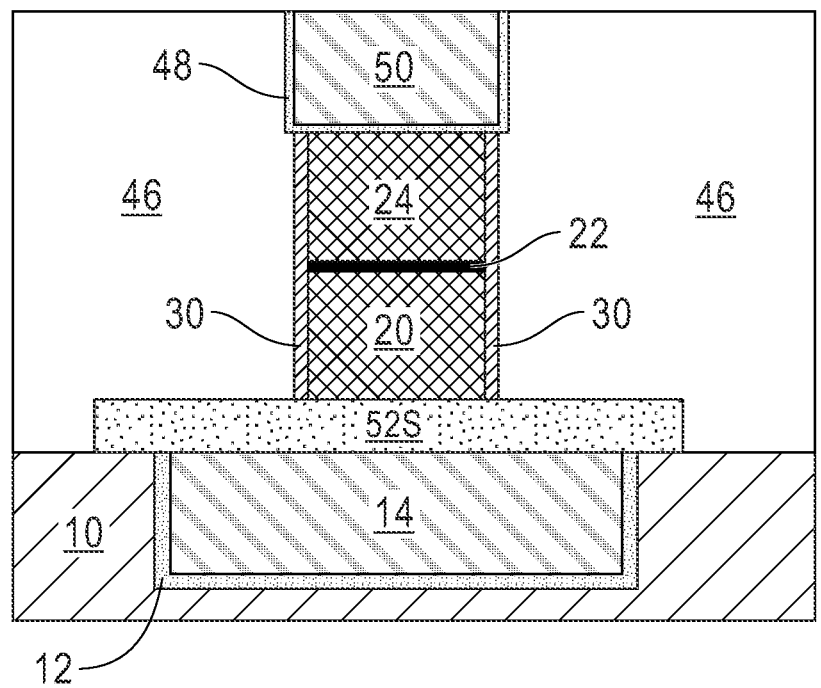
FIG. 33 is a cross sectional view of the exemplary structure of FIG. 32 after forming at least a second electrically conductive structure atop the MTJ-containing pillar.

Referring now to FIG. 33, there is illustrated the exemplary structure of FIG. 32 after forming at least a second electrically conductive structure 50 atop the MTJ-containing pillar 28; FIG. 33 represents a fifth memory structure in accordance with the present application. The second electrically conductive structure 50 is in electrical connection with the MTJ-containing pillar 28. In some embodiments, a diffusion barrier liner 48, which is U-shaped, can be present along the sidewalls and the bottom wall of the second electrically conductive structure 50. In some embodiments, the diffusion barrier liner 48 can be omitted. The second electrically conductive structure 50 has a topmost surface that is coplanar with a topmost surface of the second ILD material 46 and, if present, a topmost surface of the diffusion barrier liner 48.

The optional diffusion barrier liner 48 and the second electrically conductive structure 50 can be formed utilizing a damascene process as mentioned above for forming the optional diffusion barrier liner 12 and the first electrically conductive structure 14. When present, the diffusion barrier liner 48 can include one of the diffusion barrier materials mentioned above for diffusion barrier liner 12. The second electrically conductive structure 50 can include one of the electrically conductive materials mentioned above for the first electrically conductive structure 14. The second electrically conductive structure 50 can have a critical dimension that is equal to, less than, or greater than, the critical dimension of the MTJ-containing pillar 28. FIG. 31 is a cross sectional view of the exemplary structure of FIG. 27 after removing the maintained portion of the layer of bottom electrode metal-containing material from each vertical opening.

Figure 34:
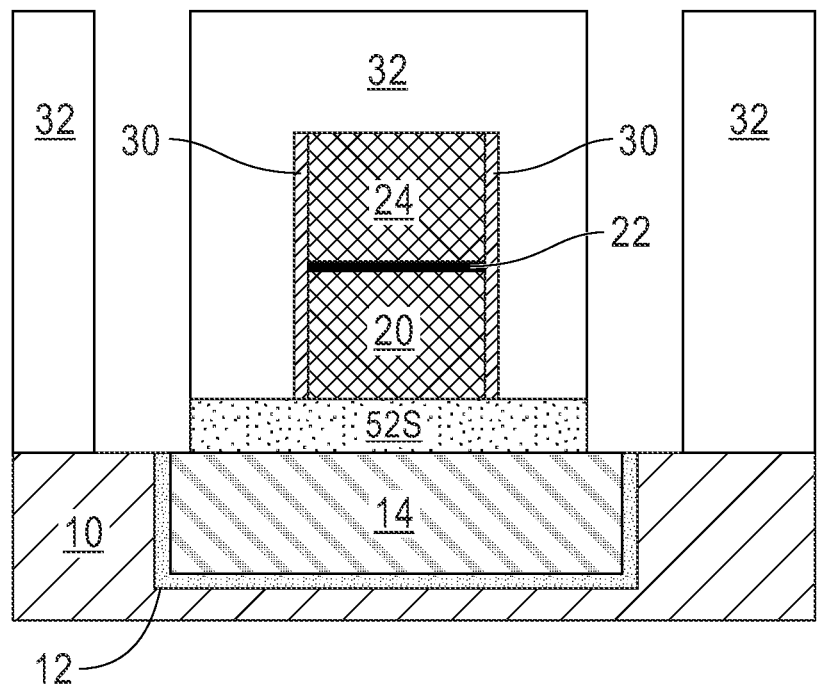
FIG. 34 is a cross sectional view of the exemplary structure of FIG. 27 after removing the maintained portion of the layer of bottom electrode metal-containing material from each vertical opening and end portions of the horizontal cavity.

Referring now to FIG. 34, there is illustrated the exemplary structure of FIG. 27 after removing the maintained portion of the layer of bottom electrode metal-containing material 52L (i.e., the replacement bottom electrode pre-structure 52) from each vertical opening 40 and at end portions of the horizontal cavity 41. The removal of replacement bottom electrode pre-structure 52 can include a metal wet etching process. As is illustrated in FIG. 34, replacement bottom electrode pre-structure 52 remains in the horizontal cavity 41. The remaining replacement bottom electrode pre-structure 52 can be referred to herein as replacement bottom electrode structure 52S. In this embodiment, the replacement bottom electrode structure 52S is located entirely beneath the MTJ-containing pillar 28 and partially covers the first electrically conductive structure 14.

Figure 35:
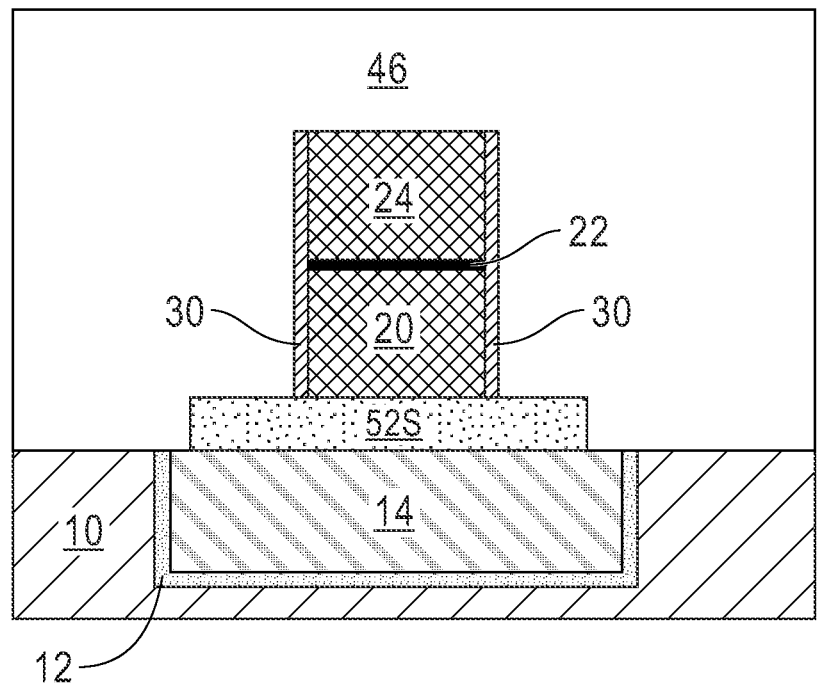
FIG. 35 is a cross sectional view of the exemplary structure of FIG. 34 after forming additional dielectric fill material within the remaining volume of each vertical opening.

Referring now to FIG. 35, there is illustrated the exemplary structure of FIG. 34 after forming additional dielectric fill material within the remaining volume of each vertical opening 50 and within each end of the horizontal cavity 41. The forming of the additional dielectric fill material includes deposition of a dielectric fill material as defined above, followed by planarization. The additional dielectric fill is composed of a dielectric material that is compositional same as the dielectric material 32 (i.e., the layer of dielectric fill material 18L and the additional dielectric material used to provide dielectric material 32). Collectively, the dielectric material 32 and the additional dielectric fill material used at this point of the present application provide a second ILD material layer 46. The second ILD material layer 46 is located laterally adjacent to, and atop, the MTJ-containing pillar 28.

Figure 36:
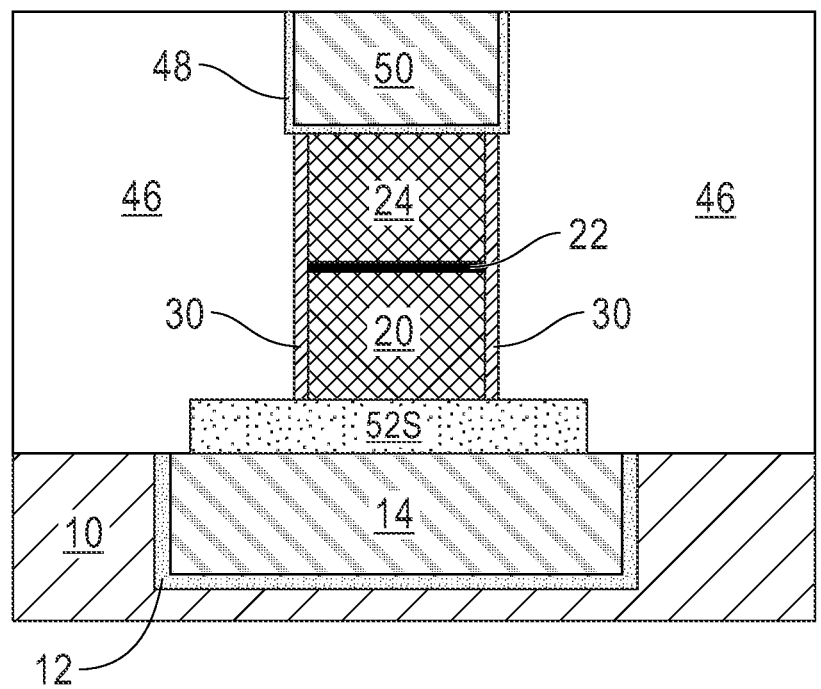
FIG. 36 is a cross sectional view of the exemplary structure of FIG. 35 after forming at least a second electrically conductive structure atop the MTJ-containing pillar.

Referring now to FIG. 36, there is illustrated the exemplary structure of FIG. 35 after forming at least a second electrically conductive structure 50 atop the MTJ-containing pillar 28; FIG. 36 represents a sixth memory structure in accordance with the present application. The second electrically conductive structure 50 is in electrical connection with the MTJ-containing pillar 28. In some embodiments, a diffusion barrier liner 48, which is U-shaped, can be present along the sidewalls and the bottom wall of the second electrically conductive structure 50. In some embodiments, the diffusion barrier liner 48 can be omitted. The second electrically conductive structure 50 has a topmost surface that is coplanar with a topmost surface of the second ILD material 46 and, if present, a topmost surface of the diffusion barrier liner 48.

The optional diffusion barrier liner 48 and the second electrically conductive structure 50 can be formed utilizing a damascene process as mentioned above for forming the optional diffusion barrier liner 12 and the first electrically conductive structure 14. When present, the diffusion barrier liner 48 can include one of the diffusion barrier materials mentioned above for diffusion barrier liner 12. The second electrically conductive structure 50 can include one of the electrically conductive materials mentioned above for the first electrically conductive structure 14. The second electrically conductive structure 50 can have a CD that is equal to, less than, or greater than, the CD of the MTJ-containing pillar 28.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
a replacement bottom electrode structure having a horizontal portion and a vertical portion extending upward from each end of the horizontal portion;
a magnetic tunnel junction (MTJ)-containing pillar located between the vertical extending portions of the replacement bottom electrode structure and above the horizontal portion of the replacement bottom electrode structure; and
an interlayer dielectric material layer embedding the MTJ-containing pillar and the replacement bottom electrode structure, wherein the interlayer dielectric material layer is located adjacent to an outermost sidewall of each vertical portion of the replacement bottom electrode structure and is present between an innermost sidewall of each vertical portion of the replacement bottom electrode structure and the MTJ-containing pillar.

2. The memory structure of claim 1, further comprising a bottom electrode diffusion barrier liner having an upper portion lining an upper surface of the replacement bottom electrode structure and a lower portion lining a lower surface of the replacement bottom electrode structure, wherein the lower portion and the upper portion of the bottom electrode diffusion barrier liner are U-shaped.

3. The memory structure of claim 2, wherein the bottom electrode diffusion barrier liner has a topmost surface that is coplanar with a topmost surface of the replacement bottom electrode structure.

4. The memory structure of claim 1, wherein the vertical extending portions of the replacement bottom electrode structure has a height that is less than a height of the MTJ-containing pillar.

5. The memory structure of claim 1, wherein the MTJ-containing pillar is a bottom pinned MTJ-containing pillar comprising, from bottom to top, a magnetic reference layer, a tunnel barrier layer and a magnetic free layer.

6. The memory structure of claim 1, wherein the MTJ-containing pillar is a top pinned MTJ-containing pillar comprising, from bottom to top, a magnetic free layer, a tunnel barrier layer and a magnetic reference layer.

7. The memory structure of claim 1, wherein MTJ-containing pillar has an uppermost surface that serves as a top electrode.

8. The memory structure of claim 1, further comprising a top electrode located on a topmost surface of the MTJ-containing pillar.

9. The memory structure of claim 1, further comprising a first electrically conductive structure located beneath the replacement bottom electrode structure and a second electrically conductive structure located above the MTJ-containing pillar.

10. The memory structure of claim 9, wherein the replacement bottom electrode structure covers an entirety of the first electrically conductive structure.

11. The memory structure of claim 1, wherein the replacement bottom electrode structure and the MTJ-containing pillar are located above a metal level including a first electrically conductive structure, and are embedded in an interlayer dielectric material layer.

12. The memory structure of claim 1, wherein the MTJ-containing pillar is void of re-sputtered bottom electrode metal particles.

13. A memory structure comprising:
a replacement bottom electrode structure;
a bottom electrode diffusion barrier liner having an upper portion lining an upper surface of the replacement bottom electrode structure and a lower portion lining a lower surface of the replacement bottom electrode structure, wherein the lower portion of the bottom electrode diffusion barrier liner is U-shaped and wherein the upper portion of the bottom electrode diffusion barrier liner is planar and is spaced apart from the lower portion of the bottom electrode diffusion barrier liner, and wherein the replacement bottom electrode structure has a topmost surface that is coplanar with a topmost surface of both the lower portion of the bottom electrode diffusion barrier and the upper portion of the bottom electrode diffusion barrier; and
a magnetic tunnel junction (MTJ)-containing pillar located entirely above the lower portion and the upper portion of the bottom electrode diffusion barrier liner and the replacement bottom electrode structure.

14. The memory structure of claim 13, further comprising a first electrically conductive structure located beneath the replacement bottom electrode structure and a second electrically conductive structure located above the MTJ-containing pillar.

15. The memory structure of claim 14, wherein the replacement bottom electrode structure covers an entirety of the first electrically conductive structure.

16. A memory structure comprising:
- a replacement bottom electrode structure having a bottommost surface in direct physical contact with a topmost surface of a lower portion of a bottom electrode diffusion barrier liner and a topmost surface in direct physical contact with a bottommost surface of an upper portion of the bottom electrode diffusion barrier liner;
- a magnetic tunnel junction (MTJ)-containing pillar located entirely above the lower portion and the upper portion of the bottom electrode diffusion barrier liner and the replacement bottom electrode structure; and
- an interlayer dielectric material layer embedding the MTJ-containing pillar, the replacement bottom electrode structure, and the upper and the lower portion of the bottom electrode diffusion barrier liner, wherein the interlayer dielectric material layer is present along, and is in direct physical contact with, an outermost sidewall of each of the upper portion of the bottom electrode diffusion liner, the replacement bottom electrode structure and the lower portion of the bottom electrode diffusion barrier liner.

17. The memory structure of claim 16, wherein the outermost sidewall of the lower portion of the bottom electrode diffusion barrier liner is vertically aligned with the outermost sidewall of both the upper portion of the bottom electrode diffusion barrier liner and the replacement bottom electrode structure.

18. The memory structure of claim 16, further comprising a first electrically conductive structure located beneath the replacement bottom electrode structure and a second electrically conductive structure located above the MTJ-containing pillar.

* * * * *